United States Patent
Cruz Mota et al.

(10) Patent No.: US 9,411,916 B2
(45) Date of Patent: Aug. 9, 2016

(54) DISTRIBUTED APPROACH FOR FEATURE MODELING USING PRINCIPAL COMPONENT ANALYSIS

(71) Applicant: Cisco Technology, Inc., San Jose, CA (US)

(72) Inventors: Javier Cruz Mota, Assens (CH); Jean-Philippe Vasseur, Saint Martin d'Uriage (FR); Andrea Di Pietro, Lausanne (CH)

(73) Assignee: Cisco Technology, Inc., San Jose, CA (US)

( * ) Notice: Subject to any disclaimer, the term of this patent is extended or adjusted under 35 U.S.C. 154(b) by 242 days.

(21) Appl. No.: 14/165,092

(22) Filed: Jan. 27, 2014

(65) Prior Publication Data

US 2015/0186775 A1 Jul. 2, 2015

Related U.S. Application Data

(60) Provisional application No. 61/922,535, filed on Dec. 31, 2013.

(51) Int. Cl.
  *G06F 17/00* (2006.01)
  *G06N 5/02* (2006.01)
  *G06F 17/50* (2006.01)

(52) U.S. Cl.
  CPC ............ *G06F 17/5009* (2013.01); *Y02E 60/76* (2013.01); *Y04S 40/22* (2013.01)

(58) Field of Classification Search
  USPC .......................................................... 706/46
  See application file for complete search history.

(56) References Cited

U.S. PATENT DOCUMENTS

| | | | |
|---|---|---|---|
| 6,442,608 B1 | 8/2002 | Knight et al. | |
| 7,346,277 B2 * | 3/2008 | Atkinson | H04J 14/0227 398/1 |
| 7,967,066 B2 * | 6/2011 | McStay | E21B 33/035 166/250.01 |
| 8,583,978 B2 * | 11/2013 | Shaffer | H04L 1/1825 714/749 |
| 8,654,649 B2 * | 2/2014 | Vasseur | H04W 40/22 370/238 |
| 9,001,669 B2 * | 4/2015 | Vasseur | H04W 40/22 370/242 |
| 9,231,965 B1 * | 1/2016 | Vasseur | H04L 63/1416 |
| 2012/0117268 A1 | 5/2012 | Shaffer et al. | |
| 2013/0019005 A1 | 1/2013 | Hui et al. | |

(Continued)

OTHER PUBLICATIONS

An Online Mechanism for BGP Instability Detection and Analysis S. Deshpande; M. Thottan; T. K. Ho; B. Sikdar IEEE Transactions on Computers Year: 2009, vol. 58, Issue: 11 pp. 1470-1484, DOI: 10.1109/TC.2009.91 IEEE Journals & Magazines.*

(Continued)

*Primary Examiner* — Michael B Holmes
(74) *Attorney, Agent, or Firm* — Parker Ibrahim & Berg LLC; James M. Behmke; Stephen D. LeBarron

(57) ABSTRACT

In one embodiment, techniques are shown and described relating to a distributed approach for feature modeling on an LLN using principal component analysis. In one specific embodiment, a computer network has a plurality of nodes and a router. The router is configured to select one or more nodes of the plurality of nodes that will collaborate with the router for collectively computing a model of respective features for input to a Principal Component Analysis (PCA) model. In addition, the selected one or more nodes and the router are configured to perform a distributed computation of a PCA model between the router and the selected one or more nodes.

22 Claims, 18 Drawing Sheets

(56) References Cited

U.S. PATENT DOCUMENTS

2013/0028106 A1 1/2013 Frost
2013/0031253 A1 1/2013 Hui et al.

OTHER PUBLICATIONS

Energy-Aware Cache Management for Content-Centric Networking S. Imai; K. Leibnitz; M. Murata Advanced Information Networking and Applications Workshops (WAINA), 2013 27th International Conference on Year: 2013 pp. 1623-1629, DOI: 10.1109/WAINA. 2013.70 IEEE Conference Publications.*
Space-Time Signal Processing for Distributed Pattern Detection in Sensor Networks R. Paffenroth; P. du Toit; R. Nong; L. Scharf; A. P. Jayasumana; V. Bandara IEEE Journal of Selected Topics in Signal Processing Year: 2013, vol. 7, Issue: 1 pp. 38-49, DOI: 10.1109/JSTSP.2012.2237381 IEEE Journals & Magazines.*
OpenClusterRouter: A Novel Cluster-Based IPv6 Backbone Router Architecture R. Tu; X. Chen; B. Wang; J. Su Wireless Communications, Networking and Mobile Computing, 2007. WiCom 2007. International Conference on Year: 2007 pp. 3075-3078, DOI: 10.1109/WICOM.2007.764 IEEE Conference Publications.*
Callegari, et al., "A Novel PCA-Based Network Anomaly Detection", International Conference on Communications, Jun. 2011, 5 pages, Institute of Electical and Electronics Engineers.
Cruz Mota, et al., "A Distributed Approach for Feature Modeling Using Principal Component Analysis", U.S. Provisional U.S. Appl. No. 61/922,535, filed Dec. 31, 2013, 39 pages, U.S. Patent and Trademark Office, Alexandria, VA.
Cruz-Mota, et al., "Sample and Pixel Weighting Strategies for Robust Incremental Visual Tracking", Transactions on Circuits and Systems for Video Technology, vol. 23, No. 5, May 2013, pp. 898-911, Institute of Electical and Electronics Engineers.
Vasseur, et al., "Routing Metrics Used for Path Calculation in Low-Power and Lossy Networks", Request for Comments 6551, Mar. 2012, 30 pages, Internet Engineering Task Force Trust.
Winter, et al., "RPL: IPv6 Routing Protocol for Low-Power and Lossy Networks", Request for Comments 6550, Mar. 2012, 157 pages, Internet Engineering Task Force Trust.

* cited by examiner

US 9,411,916 B2

DISTRIBUTED APPROACH FOR FEATURE MODELING USING PRINCIPAL COMPONENT ANALYSIS

RELATED APPLICATION

This application claims priority to U.S. Provisional Application No. 61/922,535, filed Dec. 31, 2013, entitled: A DISTRIBUTED APPROACH FOR FEATURE MODELING USING PRINCIPAL COMPONENT ANALYSIS, by Cruz Mota, et al., the contents of which are herein incorporated by reference.

TECHNICAL FIELD

The present disclosure relates generally to computer networks, and, more particularly, to the use of learning machines within computer networks.

BACKGROUND

Low power and Lossy Networks (LLNs), e.g., Internet of Things (IoT) networks, have a myriad of applications, such as sensor networks, Smart Grids, and Smart Cities. Various challenges are presented with LLNs, such as lossy links, low bandwidth, low quality transceivers, battery operation, low memory and/or processing capability, etc. The challenging nature of these networks is exacerbated by the large number of nodes (an order of magnitude larger than a "classic" IP network), thus making the routing, Quality of Service (QoS), security, network management, and traffic engineering extremely challenging, to mention a few.

Machine learning (ML) is concerned with the design and the development of algorithms that take as input empirical data (such as network statistics and performance indicators), and recognize complex patterns in these data. In general, these patterns are then used to make decisions automatically (i.e., close-loop control) or to help make decisions. ML is a very broad discipline used to tackle very different problems (e.g., computer vision, robotics, data mining, search engines, etc.), but the most common tasks are the following: linear and non-linear regression, classification, clustering, dimensionality reduction, anomaly detection, optimization, association rule learning.

One very common pattern among ML algorithms is the use of an underlying model M, whose parameters are optimized for minimizing the cost function associated to M, given the input data. For instance, in the context of classification, the model M may be a straight line that separates the data into two classes such that $M=a*x+b*y+c$ and the cost function would be the number of misclassified points. The ML algorithm then consists in adjusting the parameters a,b,c such that the number of misclassified points is minimal. After this optimization phase (or learning phase), the model M can be used very easily to classify new data points. Often, M is a statistical model, and the cost function is inversely proportional to the likelihood of M, given the input data.

Learning Machines (LMs) are computational entities that rely one or more ML algorithm for performing a task for which they haven't been explicitly programmed to perform. In particular, LMs are capable of adjusting their behavior to their environment. In the context of LLNs, and more generally in the context of the IoT (or Internet of Everything, IoE), this ability will be very important, as the network will face changing conditions and requirements, and the network will become too large for efficiently management by a network operator.

Thus far, LMs have not generally been used in LLNs, despite the overall level of complexity of LLNs, where "classic" approaches (based on known algorithms) are inefficient or when the amount of data cannot be processed by a human to predict network behavior considering the number of parameters to be taken into account.

BRIEF DESCRIPTION OF THE DRAWINGS

The embodiments herein may be better understood by referring to the following description in conjunction with the accompanying drawings in which like reference numerals indicate identically or functionally similar elements, of which.

DESCRIPTION OF EXAMPLE EMBODIMENTS

Overview

Figure 1:
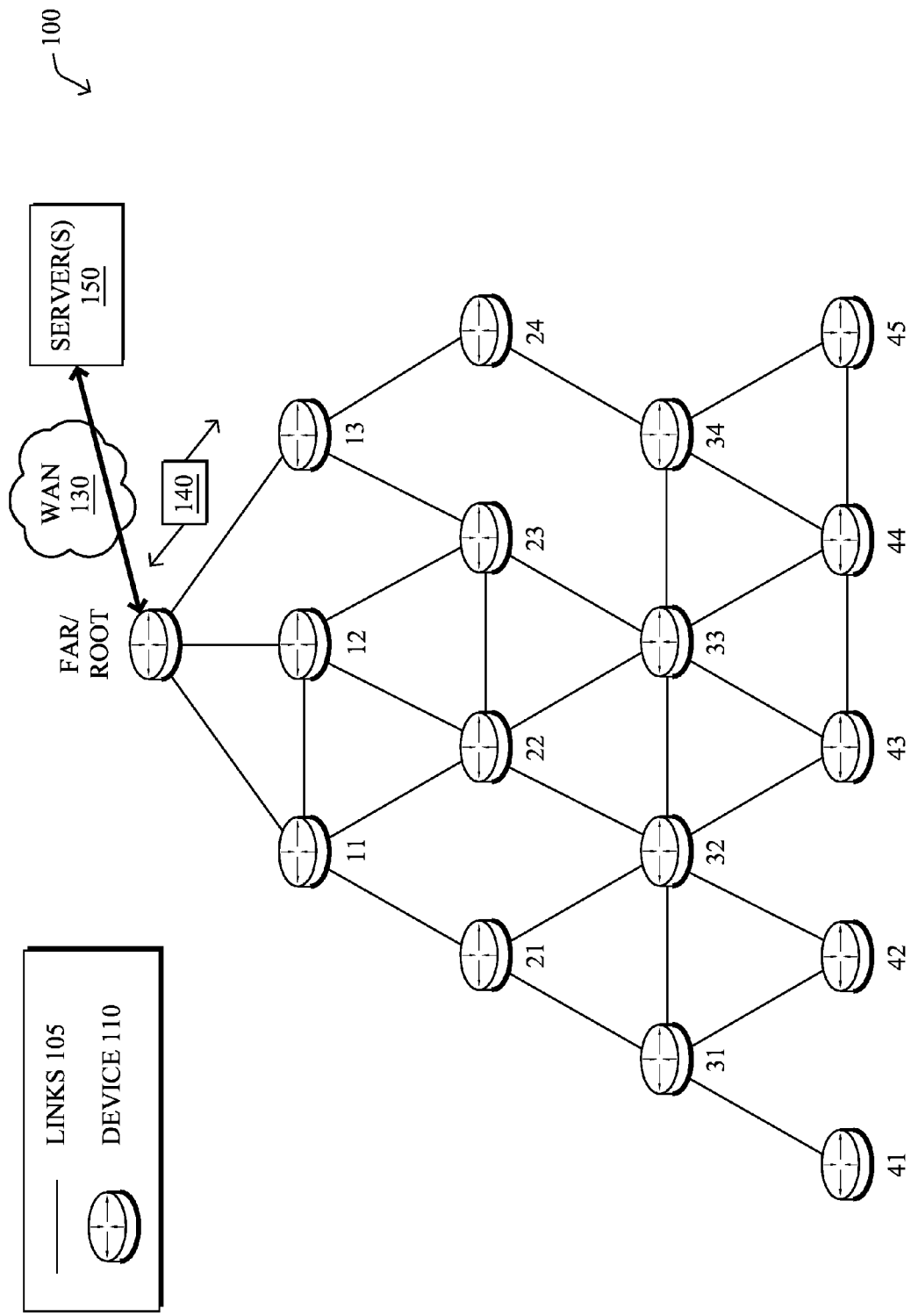
FIG. 1 illustrates an example communication network.

According to one or more embodiments of the disclosure, techniques are shown and described relating to a distributed approach for feature modeling on an LLN using principal component analysis. In one particular embodiment, a computer network has a plurality of nodes and a router. The router is configured to select one or more nodes of the plurality of nodes that will collaborate with the router for collectively computing a model of respective features for input to a Principal Component Analysis (PCA) model (e.g., learning machine model). In addition, the selected one or more nodes and the router are configured to perform a distributed computation of a PCA model between the router and the selected one or more nodes.

Description

A computer network is a geographically distributed collection of nodes interconnected by communication links and segments for transporting data between end nodes, such as personal computers and workstations, or other devices, such as sensors, etc. Many types of networks are available, ranging from local area networks (LANs) to wide area networks (WANs). LANs typically connect the nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), synchronous digital hierarchy (SDH) links, or Powerline Communications (PLC) such as IEEE 61334, IEEE 1901.2, and others. In addition, a Mobile Ad-Hoc Network (MANET) is a kind of wireless ad-hoc network, which is generally considered a self-configuring network of mobile routers (and associated hosts) connected by wireless links, the union of which forms an arbitrary topology.

Smart object networks, such as sensor networks, in particular, are a specific type of network having spatially distributed autonomous devices such as sensors, actuators, etc., that cooperatively monitor physical or environmental conditions at different locations, such as, e.g., energy/power consumption, resource consumption (e.g., water/gas/etc. for advanced metering infrastructure or "AMI" applications) temperature, pressure, vibration, sound, radiation, motion, pollutants, etc. Other types of smart objects include actuators, e.g., responsible for turning on/off an engine or perform any other actions. Sensor networks, a type of smart object network, are typically shared-media networks, such as wireless or PLC networks. That is, in addition to one or more sensors, each sensor device (node) in a sensor network may generally be equipped with a radio transceiver or other communication port such as PLC, a microcontroller, and an energy source, such as a battery. Often, smart object networks are considered field area networks (FANs), neighborhood area networks (NANs), personal area networks (PANs), etc. Generally, size and cost constraints on smart object nodes (e.g., sensors) result in corresponding constraints on resources such as energy, memory, computational speed and bandwidth.

FIG. 1 is a schematic block diagram of an example computer network 100 illustratively comprising nodes/devices 110 (e.g., labeled as shown, "root," "11," "12," . . . "45," and described in FIG. 2 below) interconnected by various methods of communication. For instance, the links 105 may be wired links or shared media (e.g., wireless links, PLC links, etc.) where certain nodes 110, such as, e.g., routers, sensors, computers, etc., may be in communication with other nodes 110, e.g., based on distance, signal strength, current operational status, location, etc. The illustrative root node, such as a field area router (FAR) of a FAN, may interconnect the local network with a WAN 130, which may house one or more other relevant devices such as management devices or servers 150, e.g., a network management server (NMS), a dynamic host configuration protocol (DHCP) server, a constrained application protocol (CoAP) server, etc. Those skilled in the art will understand that any number of nodes, devices, links, etc. may be used in the computer network, and that the view shown herein is for simplicity. Also, those skilled in the art will further understand that while the network is shown in a certain orientation, particularly with a "root" node, the network 100 is merely an example illustration that is not meant to limit the disclosure.

Data packets 140 (e.g., traffic and/or messages) may be exchanged among the nodes/devices of the computer network 100 using predefined network communication protocols such as certain known wired protocols, wireless protocols (e.g., IEEE Std. 802.15.4, WiFi, Bluetooth®, etc.), PLC protocols, or other shared-media protocols where appropriate. In this context, a protocol consists of a set of rules defining how the nodes interact with each other.

Figure 2:
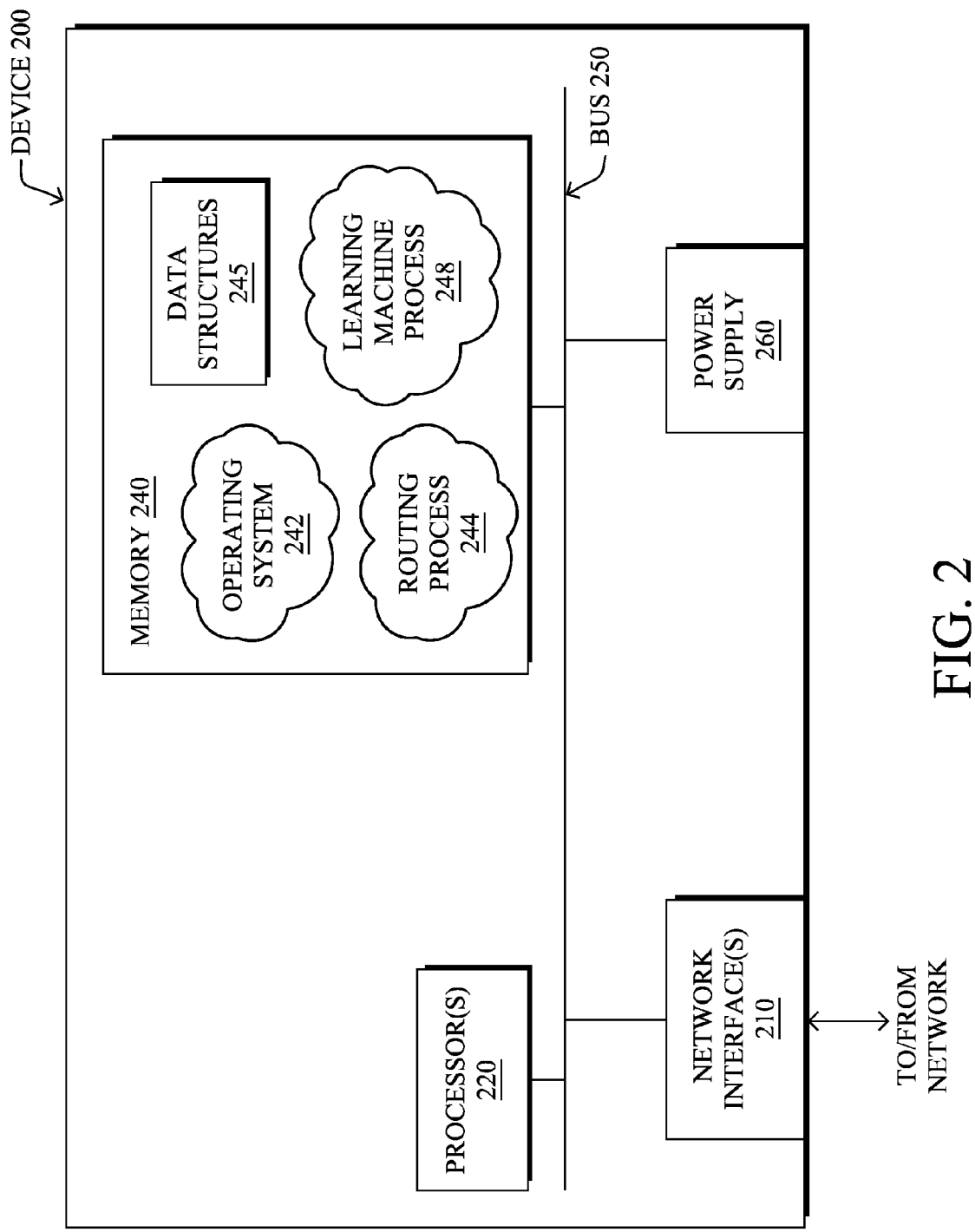
FIG. 2 illustrates an example network device/node.

FIG. 2 is a schematic block diagram of an example node/device 200 that may be used with one or more embodiments described herein, e.g., as any of the nodes or devices shown in FIG. 1 above. The device may comprise one or more network interfaces 210 (e.g., wired, wireless, PLC, etc.), at least one processor 220, and a memory 240 interconnected by a system bus 250, as well as a power supply 260 (e.g., battery, plug-in, etc.).

The network interface(s) 210 contain the mechanical, electrical, and signaling circuitry for communicating data over links 105 coupled to the network 100. The network interfaces may be configured to transmit and/or receive data using a variety of different communication protocols. Note, further, that the nodes may have two different types of network connections 210, e.g., wireless and wired/physical connections, and that the view herein is merely for illustration. Also, while the network interface 210 is shown separately from power supply 260, for PLC (where the PLC signal may be coupled to the power line feeding into the power supply) the network interface 210 may communicate through the power supply 260, or may be an integral component of the power supply.

The memory 240 comprises a plurality of storage locations that are addressable by the processor 220 and the network interfaces 210 for storing software programs and data structures associated with the embodiments described herein. Note that certain devices may have limited memory or no memory (e.g., no memory for storage other than for programs/processes operating on the device and associated caches). The processor 220 may comprise hardware elements or hardware logic adapted to execute the software programs and manipulate the data structures 245. An operating system 242, portions of which are typically resident in memory 240 and executed by the processor, functionally organizes the device by, inter alia, invoking operations in support of software processes and/or services executing on the device. These software processes and/or services may comprise a routing process/services 244 and an illustrative "learning machine" process 248, which may be configured depending upon the particular node/device within the network 100 with functionality ranging from intelligent learning machine algorithms to merely communicating with intelligent learning machines, as described herein. Note also that while the learning machine process 248 is shown in centralized memory 240, alternative embodiments provide for the process to be specifically operated within the network interfaces 210.

It will be apparent to those skilled in the art that other processor and memory types, including various computer-readable media, may be used to store and execute program instructions pertaining to the techniques described herein. Also, while the description illustrates various processes, it is expressly contemplated that various processes may be embodied as modules configured to operate in accordance with the techniques herein (e.g., according to the functionality of a similar process). Further, while the processes have been shown separately, those skilled in the art will appreciate that processes may be routines or modules within other processes.

Routing process (services) 244 contains computer executable instructions executed by the processor 220 to perform functions provided by one or more routing protocols, such as proactive or reactive routing protocols as will be understood by those skilled in the art. These functions may, on capable devices, be configured to manage a routing/forwarding table (a data structure 245) containing, e.g., data used to make routing/forwarding decisions. In particular, in proactive routing, connectivity is discovered and known prior to computing routes to any destination in the network, e.g., link state routing such as Open Shortest Path First (OSPF), or Intermediate-System-to-Intermediate-System (ISIS), or Optimized Link State Routing (OLSR). Reactive routing, on the other hand, discovers neighbors (i.e., does not have an a priori knowledge of network topology), and in response to a needed route to a destination, sends a route request into the network to determine which neighboring node may be used to reach the desired destination. Example reactive routing protocols may comprise Ad-hoc On-demand Distance Vector (AODV), Dynamic Source Routing (DSR), DYnamic MANET On-demand Routing (DYMO), etc. Notably, on devices not capable or configured to store routing entries, routing process 244 may consist solely of providing mechanisms necessary for source routing techniques. That is, for source routing, other devices in the network can tell the less capable devices exactly where to send the packets, and the less capable devices simply forward the packets as directed.

Notably, mesh networks have become increasingly popular and practical in recent years. In particular, shared-media mesh networks, such as wireless or PLC networks, etc., are often on what is referred to as Low-Power and Lossy Networks (LLNs), which are a class of network in which both the routers and their interconnect are constrained: LLN routers typically operate with constraints, e.g., processing power, memory, and/or energy (battery), and their interconnects are characterized by, illustratively, high loss rates, low data rates, and/or instability. LLNs are comprised of anything from a few dozen and up to thousands or even millions of LLN routers, and support point-to-point traffic (between devices inside the LLN), point-to-multipoint traffic (from a central control point such at the root node to a subset of devices inside the LLN) and multipoint-to-point traffic (from devices inside the LLN towards a central control point).

An example implementation of LLNs is an "Internet of Things" network. Loosely, the term "Internet of Things" or "IoT" (or "Internet of Everything" or "IoE") may be used by those in the art to refer to uniquely identifiable objects (things) and their virtual representations in a network-based architecture. In particular, the next frontier in the evolution of the Internet is the ability to connect more than just computers and communications devices, but rather the ability to connect "objects" in general, such as lights, appliances, vehicles, HVAC (heating, ventilating, and air-conditioning), windows and window shades and blinds, doors, locks, etc. The "Internet of Things" thus generally refers to the interconnection of objects (e.g., smart objects), such as sensors and actuators, over a computer network (e.g., IP), which may be the Public Internet or a private network. Such devices have been used in the industry for decades, usually in the form of non-IP or proprietary protocols that are connected to IP networks by way of protocol translation gateways. With the emergence of a myriad of applications, such as the smart grid, smart cities, and building and industrial automation, and cars (e.g., that can interconnect millions of objects for sensing things like power quality, tire pressure, and temperature and that can actuate engines and lights), it has been of the utmost importance to extend the IP protocol suite for these networks.

An example protocol specified in an Internet Engineering Task Force (IETF) Proposed Standard, Request for Comment (RFC) 6550, entitled "RPL: IPv6 Routing Protocol for Low Power and Lossy Networks" by Winter, et al. (March 2012), provides a mechanism that supports multipoint-to-point (MP2P) traffic from devices inside the LLN towards a central control point (e.g., LLN Border Routers (LBRs), FARs, or "root nodes/devices" generally), as well as point-to-multipoint (P2MP) traffic from the central control point to the devices inside the LLN (and also point-to-point, or "P2P" traffic). RPL (pronounced "ripple") may generally be described as a distance vector routing protocol that builds a Directed Acyclic Graph (DAG) for use in routing traffic/packets 140, in addition to defining a set of features to bound the control traffic, support repair, etc. Notably, as may be appreciated by those skilled in the art, RPL also supports the concept of Multi-Topology-Routing (MTR), whereby multiple DAGs can be built to carry traffic according to individual requirements.

Also, a directed acyclic graph (DAG) is a directed graph having the property that all edges are oriented in such a way that no cycles (loops) are supposed to exist. All edges are contained in paths oriented toward and terminating at one or more root nodes (e.g., "clusterheads" or "sinks"), often to interconnect the devices of the DAG with a larger infrastructure, such as the Internet, a wide area network, or other domain. In addition, a Destination Oriented DAG (DODAG) is a DAG rooted at a single destination, i.e., at a single DAG root with no outgoing edges. A "parent" of a particular node within a DAG is an immediate successor of the particular node on a path towards the DAG root, such that the parent has a lower "rank" than the particular node itself, where the rank of a node identifies the node's position with respect to a DAG root (e.g., the farther away a node is from a root, the higher is the rank of that node). Note also that a tree is a kind of DAG, where each device/node in the DAG generally has one parent or one preferred parent. DAGs may generally be built (e.g., by a DAG process and/or routing process 244) based on an Objective Function (OF). The role of the Objective Function is generally to specify rules on how to build the DAG (e.g. number of parents, backup parents, etc.).

Figure 3:
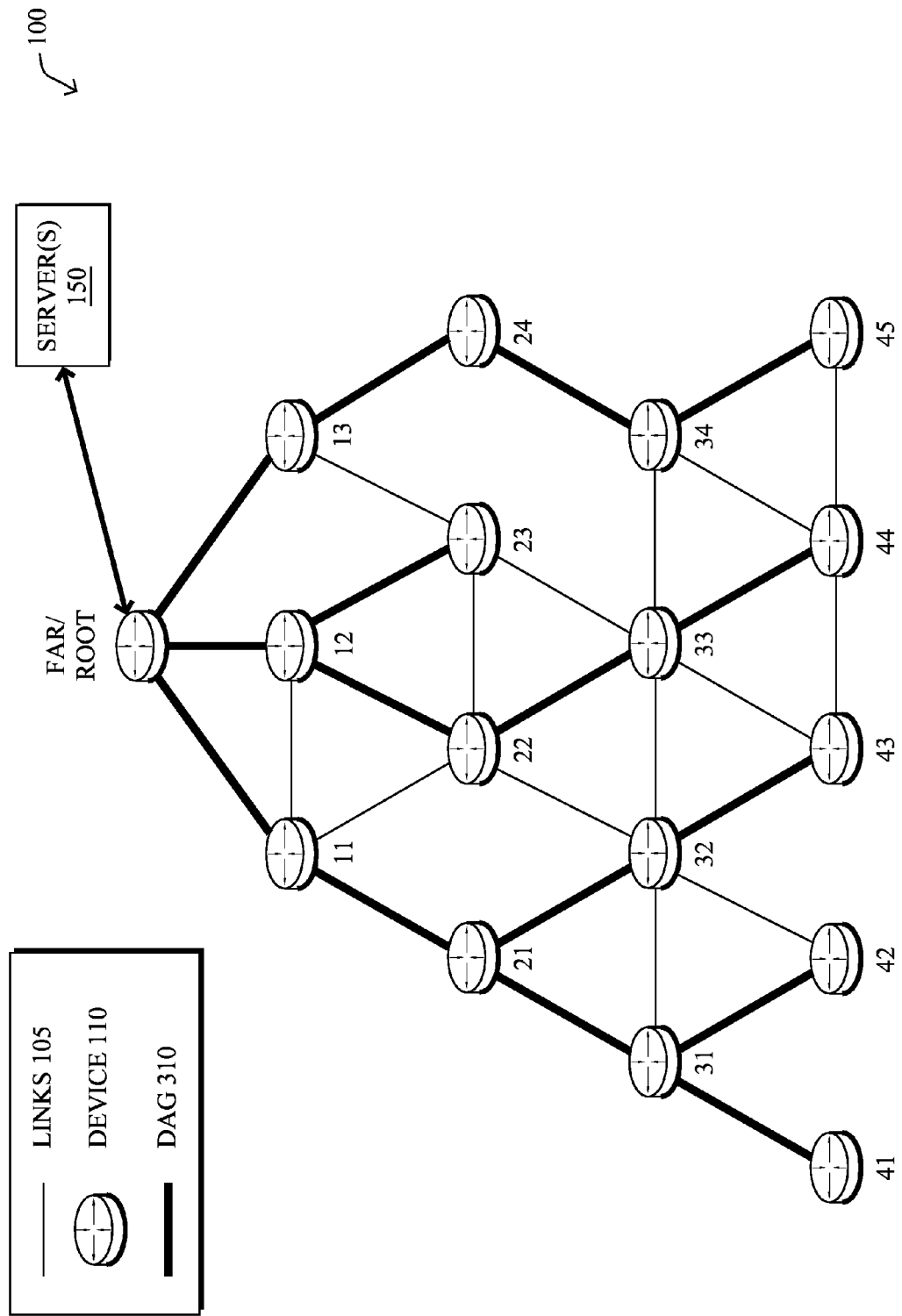
FIG. 3 illustrates an example directed acyclic graph (DAG) in the communication network of FIG. 1.

FIG. 3 illustrates an example simplified DAG that may be created, e.g., through the techniques described above, within network 100 of FIG. 1. For instance, certain links 105 may be selected for each node to communicate with a particular parent (and thus, in the reverse, to communicate with a child, if one exists). These selected links form the DAG 310 (shown as bolded lines), which extends from the root node toward one or more leaf nodes (nodes without children). Traffic/packets 140 (shown in FIG. 1) may then traverse the DAG 310 in either the upward direction toward the root or downward toward the leaf nodes, particularly as described herein.

Learning Machine Technique(s)

As noted above, machine learning (ML) is concerned with the design and the development of algorithms that take as input empirical data (such as network statistics and performance indicators), and recognize complex patterns in these data. One very common pattern among ML algorithms is the use of an underlying model M, whose parameters are optimized for minimizing the cost function associated to M, given the input data. For instance, in the context of classification, the model M may be a straight line that separates the data into two classes such that $M=a*x+b*y+c$ and the cost function would be the number of misclassified points. The ML algorithm then consists in adjusting the parameters a,b,c such that the number of misclassified points is minimal. After this optimization phase (or learning phase), the model M can be used very easily to classify new data points. Often, M is a statistical model, and the cost function is inversely proportional to the likelihood of M, given the input data.

As also noted above, learning machines (LMs) are computational entities that rely one or more ML algorithm for performing a task for which they haven't been explicitly programmed to perform. In particular, LMs are capable of adjusting their behavior to their environment. In the context of LLNs, and more generally in the context of the IoT (or Internet of Everything, IoE), this ability will be very important, as the network will face changing conditions and requirements, and the network will become too large for efficiently management by a network operator. Thus far, LMs have not generally been used in LLNs, despite the overall level of complexity of LLNs, where "classic" approaches (based on known algorithms) are inefficient or when the amount of data cannot be processed by a human to predict network behavior considering the number of parameters to be taken into account.

In this context, LM are powerful tools in applications such as anomaly detection, attack detection, close loop control, etc. In all of these applications, a model of the behavior of a node and/or the patterns present in its describing features is needed for predicting, for instance, the behavior of the node in the future, when the node does not behave as usual, the parameters that are generating a particular behavior, etc.

However, the high number of nodes in LLNs (an order of magnitude larger than classic IP networks) and the potentially high number of features that can be required for describing a node behavior (for instance, LQI, RSSI, ETX, number of neighbors, number of hops to the FAR, characteristics of the neighbors, amount of traffic, physical characteristics, computational resources, etc.) can turn this modeling problem into an extremely demanding problem in terms of computational power. Furthermore, if the computations are centralized, this problem may also require high amounts of data transfers from the nodes to the computational entity.

A well-adapted algorithm for computing such a model is the Principal Component Analysis (PCA) algorithm. PCA is a mathematical technique for dimensionality reduction, widely used on high-dimensional data analysis, data compression and data modeling. Given a dataset, the PCA algorithm computes a projection matrix (or PCA matrix or PCA model) that transforms the set of original samples of possibly correlated variables, into a set of values of linearly uncorrelated variables, known as the Principal Components, which is particularly useful in LLNs where the dimensionality is high and features are correlated. The problem of the standard algorithm of PCA is that it requires having all the data available before computing the PCA model. However, there exist incremental algorithms for computing this PCA model on a small subset of the dataset and then update the result when additional data is available.

The techniques herein propose a mechanism for computing a PCA model of the features of nodes in a LLN. The computation of such a model is distributed amongst all the nodes of the LLN and the Field Area Router (FAR) managing it. For doing so, the techniques herein adapt an incremental PCA algorithm to perform in a distributed environment, which distributes the computational charge and reduces the network traffic, which is of the utmost importance in constrained networks. The model computed using the mechanism described herein has applications in, for instance, the detection of anomalous nodes in the network.

Said differently, the techniques herein introduce a mechanism for distributing, between the nodes and the router of a LLN, the computation of a PCA model of node features. This algorithm uses an adapted version of an incremental PCA algorithm, and distributes the computations between the different elements of the network according to their capabilities and the network constraints. Indeed, computations requiring low computational power are computed directly on the node, while heavy computations are performed on the router. This reduces the number of computations that have to be performed by the router, at the same time that reduces the quantity of information that the nodes have to send to the router (thanks to the capacity of the PCA to compress data). Note that although the computations performed by the nodes are lightweight, the high number of nodes in these networks, and therefore the high number of computations that have to be performed, could easily saturate the router if the mechanisms described herein are not used.

Note that although this invention is described in the context of LLNs, it can be applied to any network where having a model of node features can be of interest.

Illustratively, the techniques described herein may be performed by hardware, software, and/or firmware, such as in accordance with the learning machine process 248, which may contain computer executable instructions executed by the processor 220 (or independent processor of interfaces 210) to perform functions relating to the techniques described herein, e.g., optionally in conjunction with other processes. For example, certain aspects of the techniques herein may be treated as extensions to conventional protocols, such as the various communication protocols (e.g., routing process 244), and as such, may be processed by similar components understood in the art that execute those protocols, accordingly. Also, while certain aspects of the techniques herein may be described from the perspective of a single node/device, embodiments described herein may be performed as distributed intelligence, also referred to as edge/distributed computing, such as hosting intelligence within nodes 110 of a Field Area Network in addition to or as an alternative to hosting intelligence within servers 150.

Operationally, as shown in (and with general reference to) FIGS. 4A-8, the techniques herein specify a mechanism for computing a model of the feature set characterizing a set of nodes. The model is computed in a distributed way between a (Field Area) Router (or switch, the terms being used interchangeably) and one or several nodes, in order to reduce the computational cost of this computation in the router as well as the amount of traffic that has to be sent from nodes to the router, which again is critical in constrained networks such as LLNs.

The techniques herein generally consist of two components. The first component performs a selection of the nodes that will collaborate with the router for collectively computing a model of their features (as a reminder the "feature" is an input of a Learning Machine (LM)). Note that this selection can consist in a single node in case a model of a particular node wants to be computed. The second component performs a distributed computation of a PCA model between the router and the involved set of nodes.

First, some elements used by the components of the techniques herein may be defined as follows:

C denotes the list of candidate nodes whose features want to be modeled and |C| is the number of nodes in this list, i.e. $C=\{C\_1, C\_2, \ldots, C\_|C|\}$.

F denotes the set of features that are considered for computing the model and |F| is the number of features that form this set, i.e. $F=\{F\_1, F\_2, \ldots, F\_|F|\}$. For instance, $F\_1$ can be the $RSS_1$, $F\_2$ the LQI, etc.

Z_i denotes the set of N_i samples collected by device i. Z_i is a matrix where each row corresponds to a specific feature and each one of the N_i columns corresponds to a sample (a set of features at a specific instant).

Mu_i denotes the column-wise mean value of Z_i.

U_R denotes the PCA projection matrix stored in the router.

Mu_R is the column-wise mean value of the data considered for computing U_R, i.e. the column-wise mean value of the concatenation of all the Z_i matrices that have been used for computing the PCA matrix.

N_R denotes the number of samples considered for computing U_R.

Figure 4A:
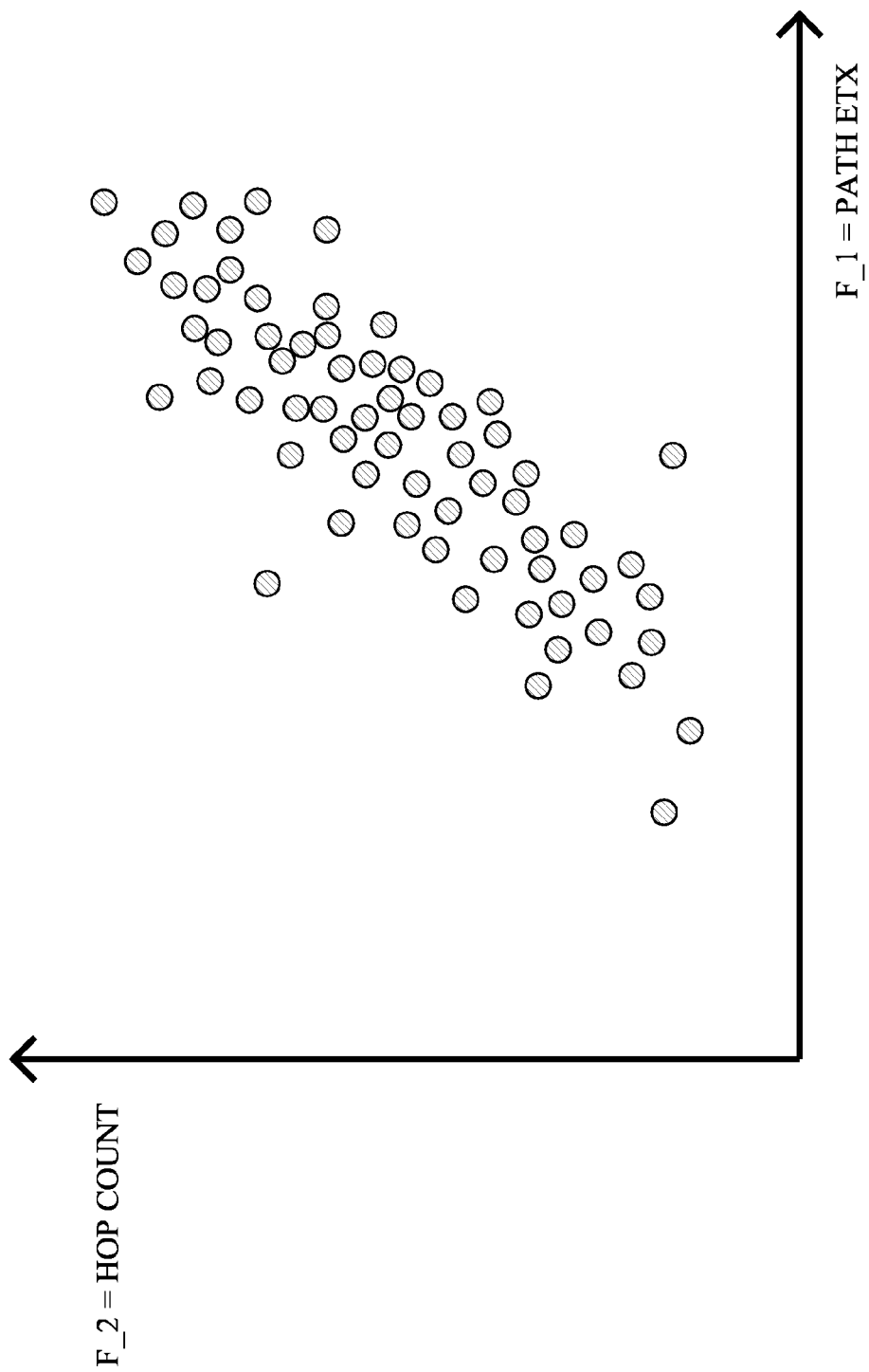
FIGS. 4A-4G illustrate an example illustrating collected samples, variable correlation, a principal component analysis projection matrix, and a principal component analysis basis.
Figure 4B:
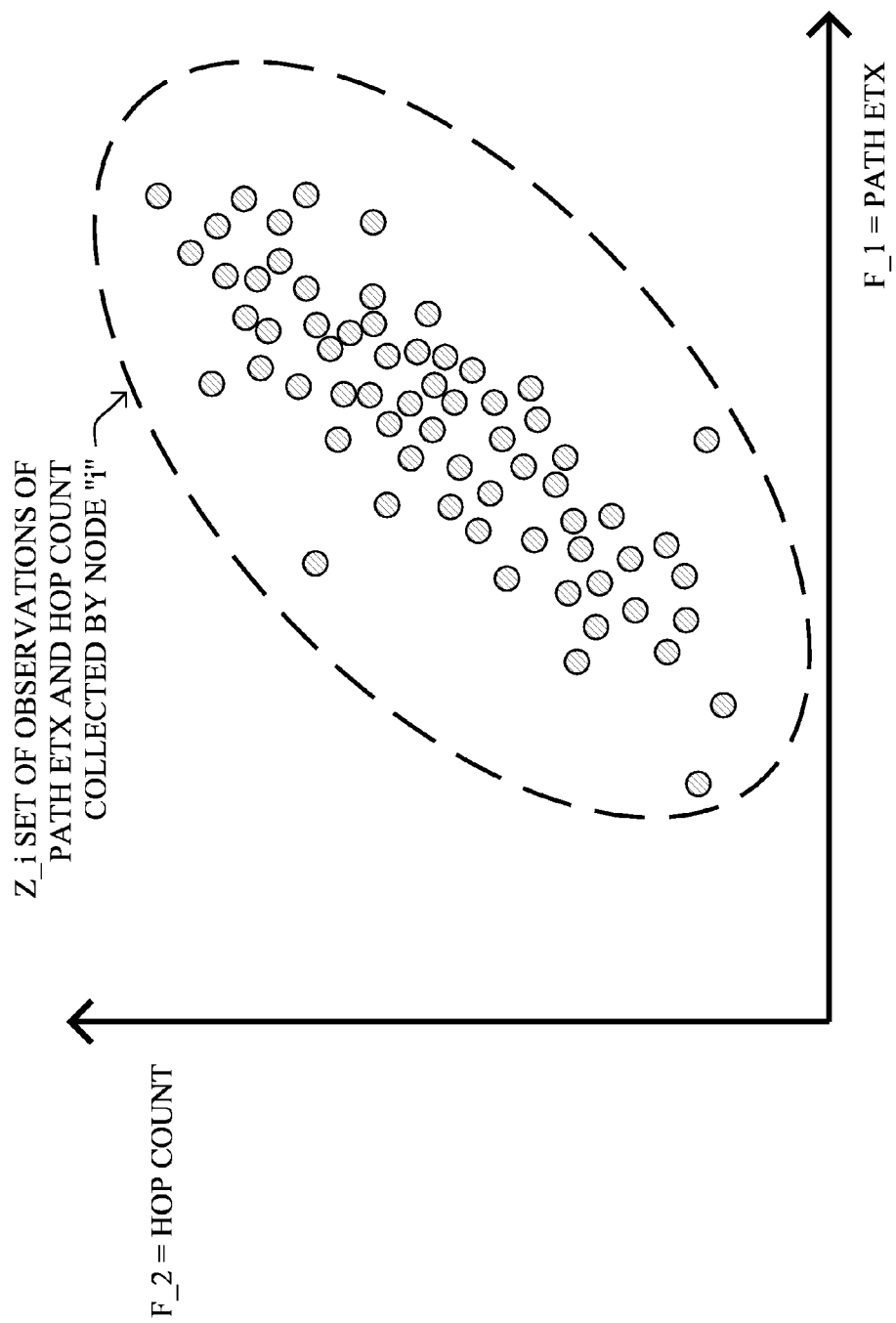
Figure 4C:
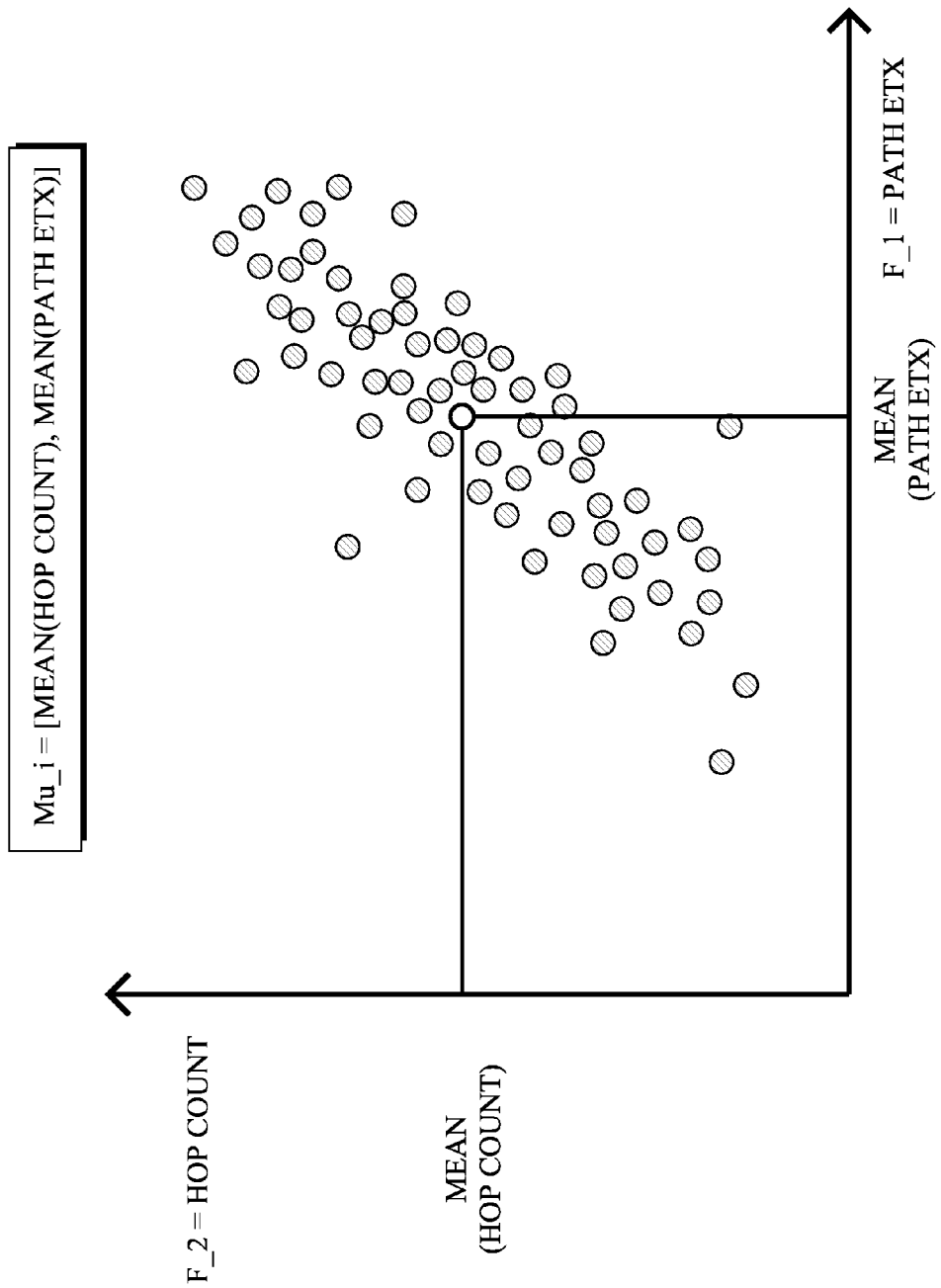
Figure 4D:
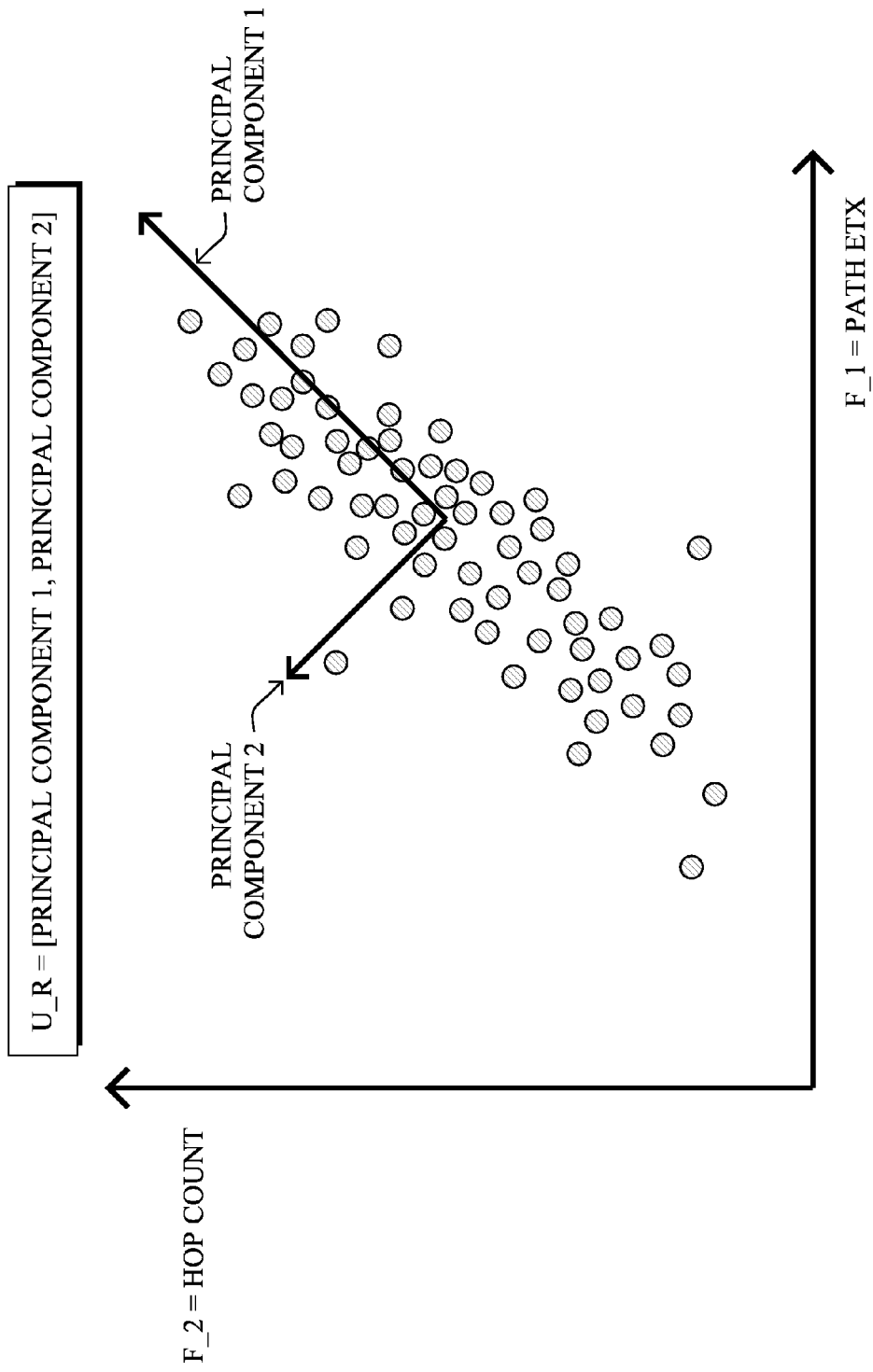
Figure 4E:
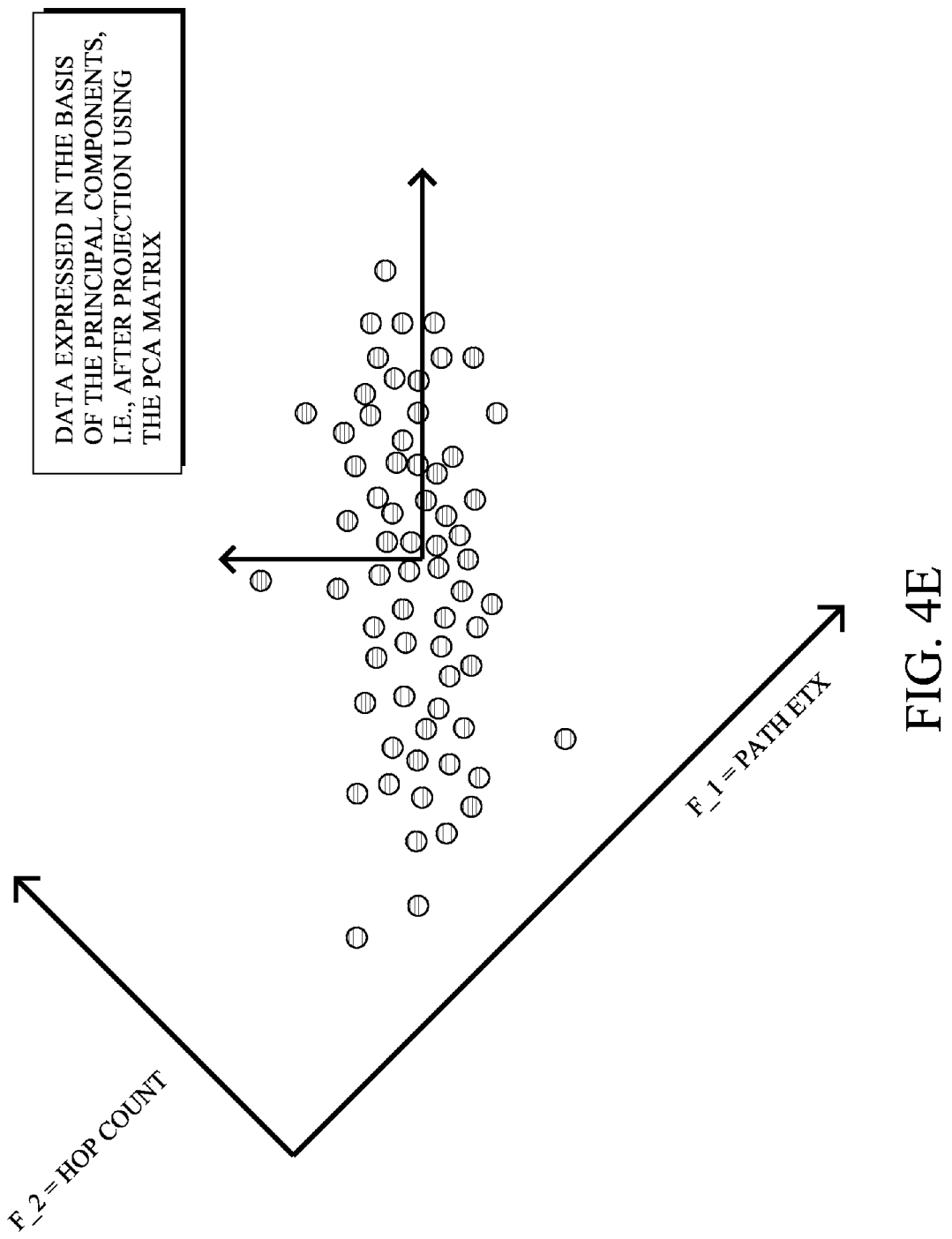
Figure 4F:
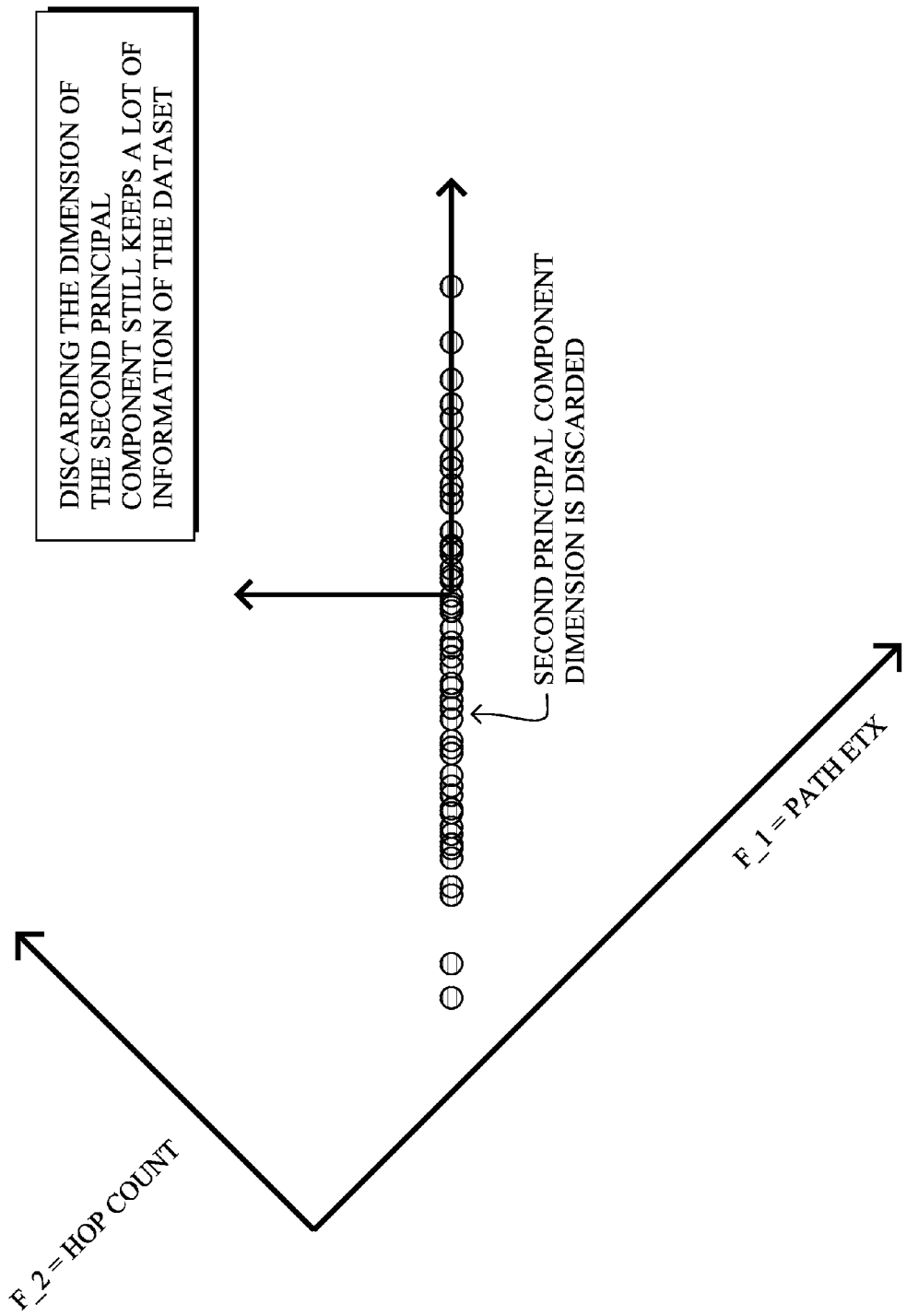
Figure 4G:
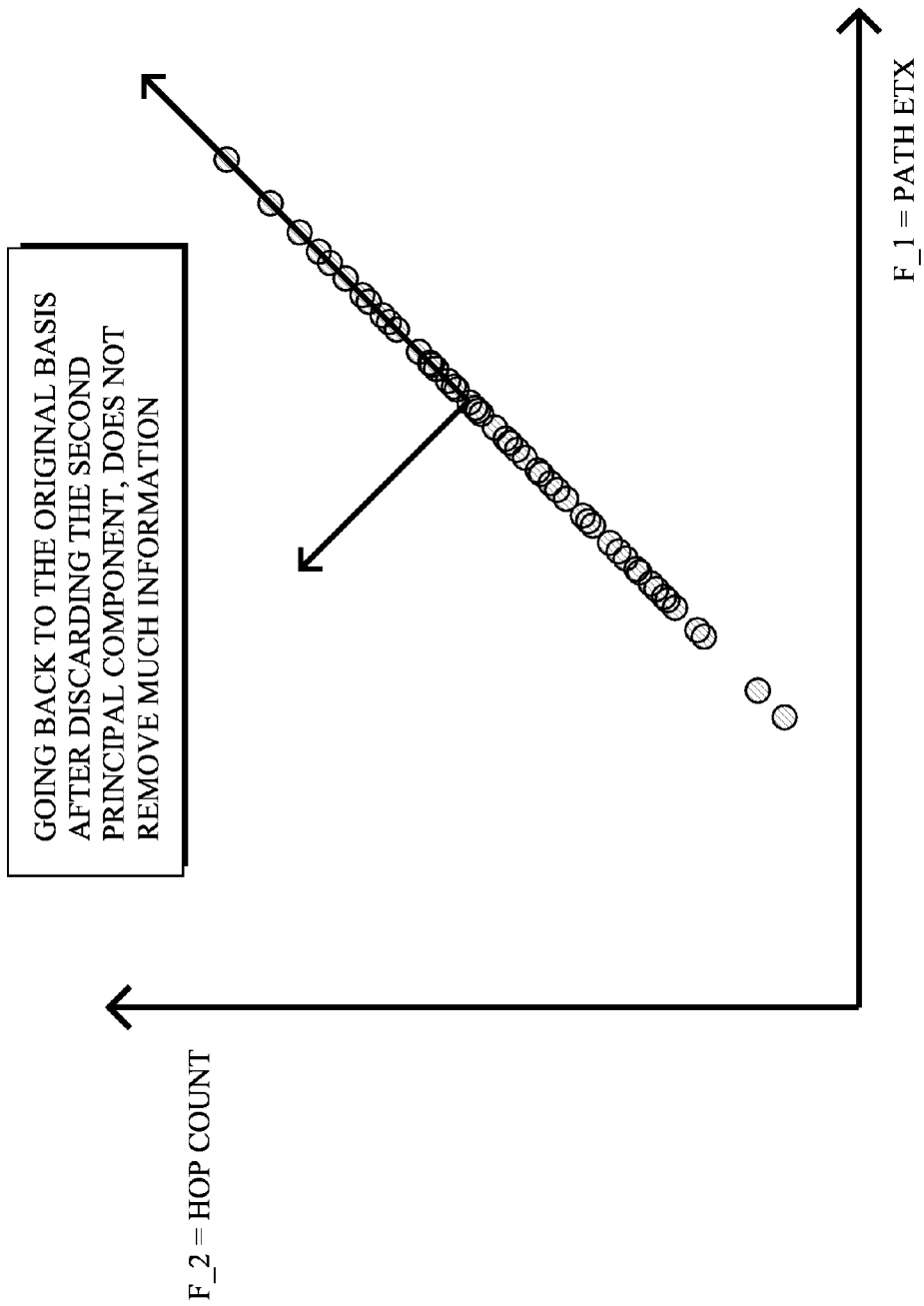

In FIGS. 4A-4B, there is an example illustrating these variables for a case where the samples collected by node i consist of observations of two features, the Path ETX and the Hop Count. There, it can be easily observed that there is a correlation between the Path ETX and the Hop Count (the mean of which illustrated in FIG. 4C, as described below), and this correlation is captured by the PCA projection matrix (FIG. 4D). Indeed, in FIG. 4E, the same dataset is represented but expressed in the PCA basis, i.e. after projection using the U_R matrix. There, it is easy to see that using this new basis, data can be compressed without losing too much information (see FIGS. 4F-4G). This compression capacity of the PCA is used below.

The first component of the techniques herein performs the selection of the nodes of interest for the model computation. The router generates a list of candidates C containing the nodes whose features need to be modeled. This list can contain, just for giving a few examples, only nodes that are indoors, only nodes that are outdoors, all the nodes in the network, only one node that is very central in the logical structure of the network or only nodes that are on batteries. Note that the list C may be built from the NMS, which is responsible for classifying the set of nodes according to their characteristics.

Figure 5A:
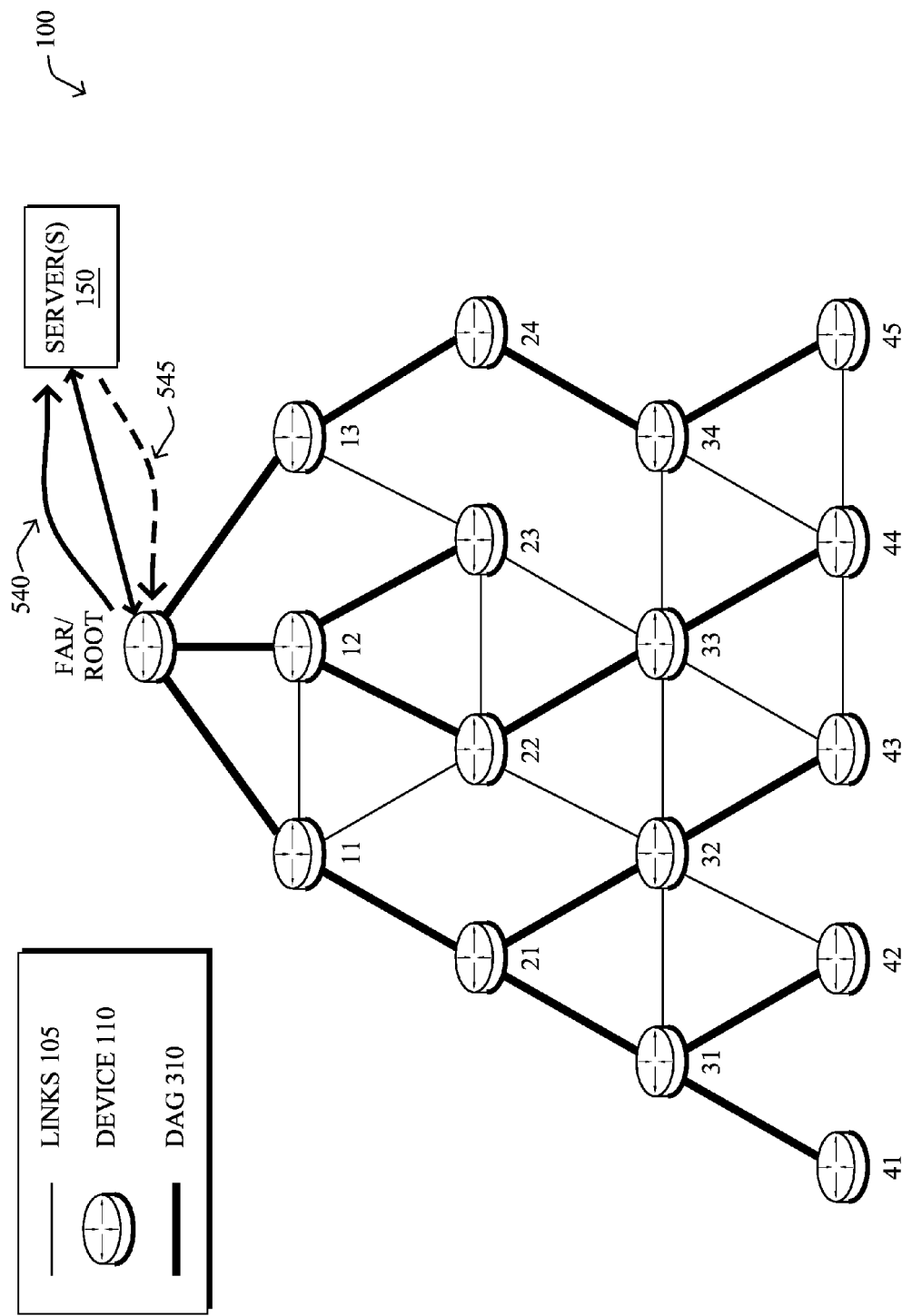
FIGS. 5A-5B illustrate example message passing for a distributed approach for feature modeling.

The list C is then sent from the router (e.g. FAR, Switch) to a policy engine that can be either co-located or remote. If the policy engine is co-located with the router, a check is performed to determine the nodes in the candidate list that can effectively participate in the model computation. This check produces a filtered list of candidates C', which is a subset of C. If the policy engine is remote, as shown in FIG. 5A, the techniques herein specify a newly defined network management IPv6 unicast message 540 from the router to the policy engine, which contains the list of candidates C. The policy engine then returns a reply message 545 that may contain C', the filtered version of C. In both cases, the router will also check the availability of enough resources for each node of the list. For instance, the request could be refused due to the amount of computational resources that would be needed in the router, which could be incompatible with some particular activities that are currently running or will run in the near future. Note that determining whether a node can participate in the computation is both governed by policy involving the policy engine, and when available dynamic discovery of the resources available on the node (for example, should RPL be used as a routing protocol, the FAR may inspect the node routing metric(s) as specified in RFC6551; for the sake of illustration the FAR may exclude from the list C all nodes for which the E_E value is below some pre-defined thresholds).

Figure 5B:
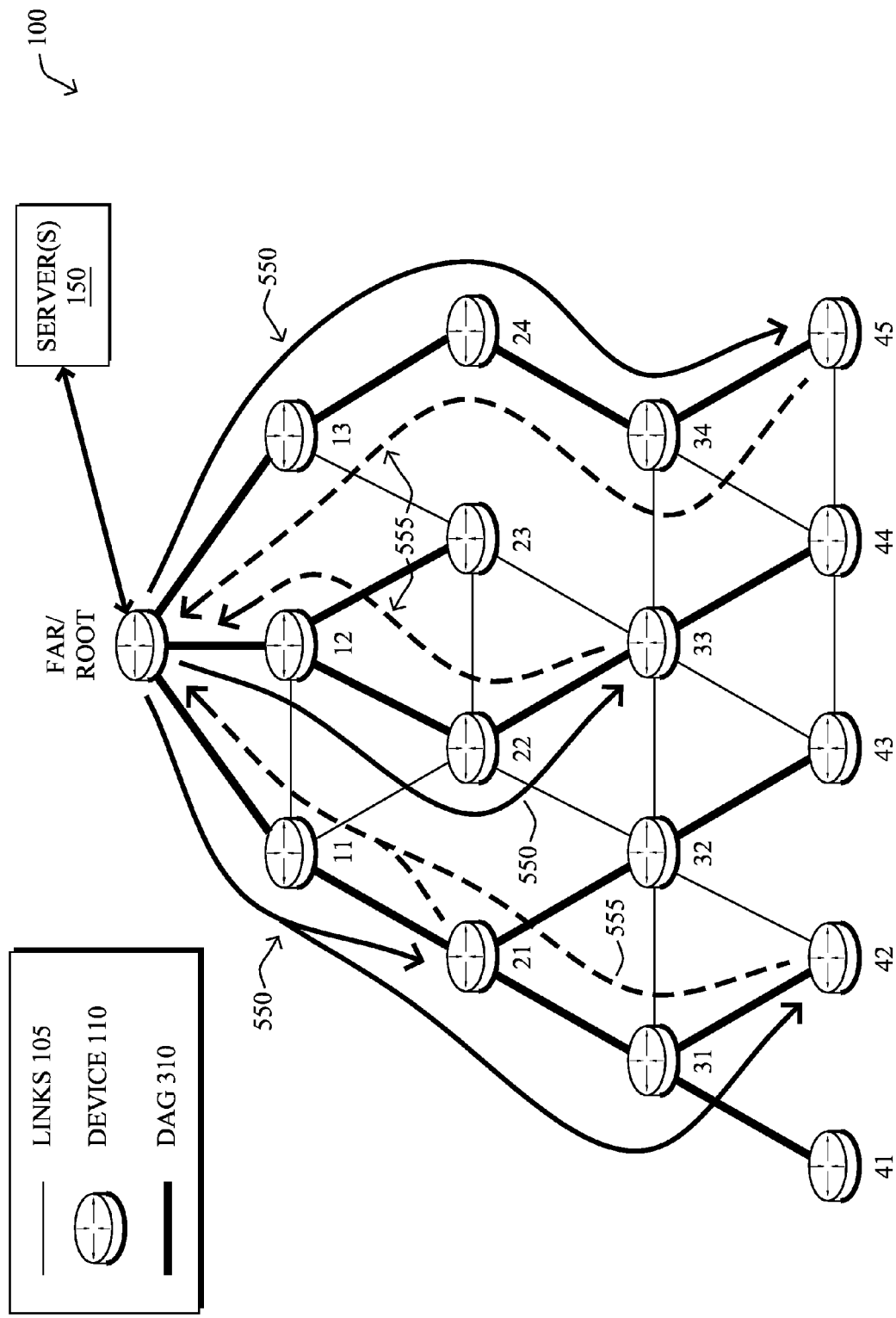

Once the router has computed the list C', as shown in FIG. 5B, the nodes involved in the computation are notified (message 550) to start the local collection of features, local computations and the communications with the requesting router. To that end, the techniques herein specify a newly defined IPv6 message 550.

If |C'|<L (L being a pre-configured number of nodes), the message is sent as a unicast IPv6 message. Otherwise, the message is sent as a multicast IPv6 message to a well-known multicast group address and carried out within a broadcast link-layer frame.

The IPv6 message contains the following TLVs:
  If the message is multicast, the list of nodes in the set C' in form of compressed (e.g. for example using a bloom filter) or non-compressed addresses.
  The set of features that have to be modeled, i.e. F.
  The number of samples that have to be collected by the node, i.e. N_i, for each update of the model.
  Optionally, the current values of Mu_R and N_R. If these values are not specified, null values are assumed.
  Optionally, the current value of U_R. If it is not specified, the nodes assume the identity matrix.

Upon reception of this message, each node replies to the router with a newly defined IPv6 unicast message 555 indicating whether the node accepts or refuses the computation. A reason for refusing the computation could be a low battery charge level (in battery operated devices) or the impossibility of collecting the required features at this time, for mentioning some examples.

The second component of the techniques herein specifies the computations required on the router and the node sides in order to compute and update the model, as well as the communications required for transferring the results. The details of the equations are explained below. (Note that the incremental PCA algorithm is generally understood in the art, but the techniques herein are directed to the distribution of the computation in a constrained network, taking into account node capabilities and network constraints.)

1) Standard PCA Algorithm:

Given a set of N data samples $Z=[z_1; \ldots ; z_N] \in R^{M \times N}$, normalized and with column-wise mean $\mu$, where each sample is represented as a column vector $z \in R^M$, the PCA algorithm computes the projection matrix (or PCA matrix or PCA model) $U \in R^{M \times M'}$, such that the data expressed in the new base $Y=U^T(Z-\mu)$ does not present any correlation between variables. This is equivalent to compute a base where the variance of Z along each component is maximized, which is equivalent to compute the matrix U that minimizes the reconstruction error, i.e. that minimizes $\|(Z-\mu)-UU^T(Z-\mu)\|^2$.

The columns of U are called the Principal Components and are the eigenvectors of the covariance matrix of $Z-\mu$, which can be directly and efficiently computed using the Singular Value Decomposition of the matrix $Z-\mu$, i.e., $SVD(Z-\mu)=U\Sigma V^T$. Note that Principal Component Analysis can be used for performing lossy data compression. This is achieved by discarding the eigenvectors with smallest eigenvalues, i.e., the columns of U with smallest values in the diagonal matrix $\Sigma$.

2) Incremental PCA Algorithm:

Given $U_{(1)}$ and $\Sigma_{(1)}$ (from a dataset $Z_{(1)}$ with $N_{(1)}$ samples and column-wise mean $\mu_{(1)}$) and a new data matrix $Z_{(2)}$ (with $N_{(2)}$ samples and column-wise mean $\mu_{(2)}$) the following incremental PCA algorithm computes $U_{(1,2)}, \Sigma_{(1,2)}$ and $\mu_{(1,2)}$ from the total dataset without using $Z_{(1)}$:

1: New data adaptation step: compute $$\tilde{Z}_{(2)} = \left[ Z_{(2)} - \mu_{(2)}, \sqrt{\frac{N_{(1)}N_{(2)}}{N_{(1)} + N_{(2)}}} (\mu_{(1)} - \mu_{(2)}) \right],$$

where $Z_{(2)}-\mu_{(2)}$ denotes the subtraction of $\mu_{(2)}$ from each column of $Z_{(2)}$ 2: Orthogonalization step: compute $\perp \tilde{Z}_{(2)} = \text{orth}(\tilde{Z}_{(2)} - U_{(1)} U_{(1)}^T \tilde{Z}_{(2)})$, where the orth( ) operator denotes orthogonalisation and can be computed by performing a QR decomposition.

3: Compute R matrix: compute $$R = \begin{bmatrix} \Sigma_{(1)} & U_{(1)}^T \tilde{Z}_{(2)} \\ 0 & \perp \tilde{Z}_{(2)}^T (\tilde{Z}_{(2)} - U_{(1)} U_{(1)}^T \tilde{Z}_{(2)}) \end{bmatrix}$$

4: Compute SVD: Compute $SVD(R) = U' \Sigma' V'^T$

5: Updated mean:

$$\mu_{(1,2)} = \frac{N_{(1)}}{N_{(1)} + N_{(2)}} \mu_{(1)} + \frac{N_{(2)}}{N_{(1)} + N_{(2)}} \mu_{(2)}$$

Figure 6:
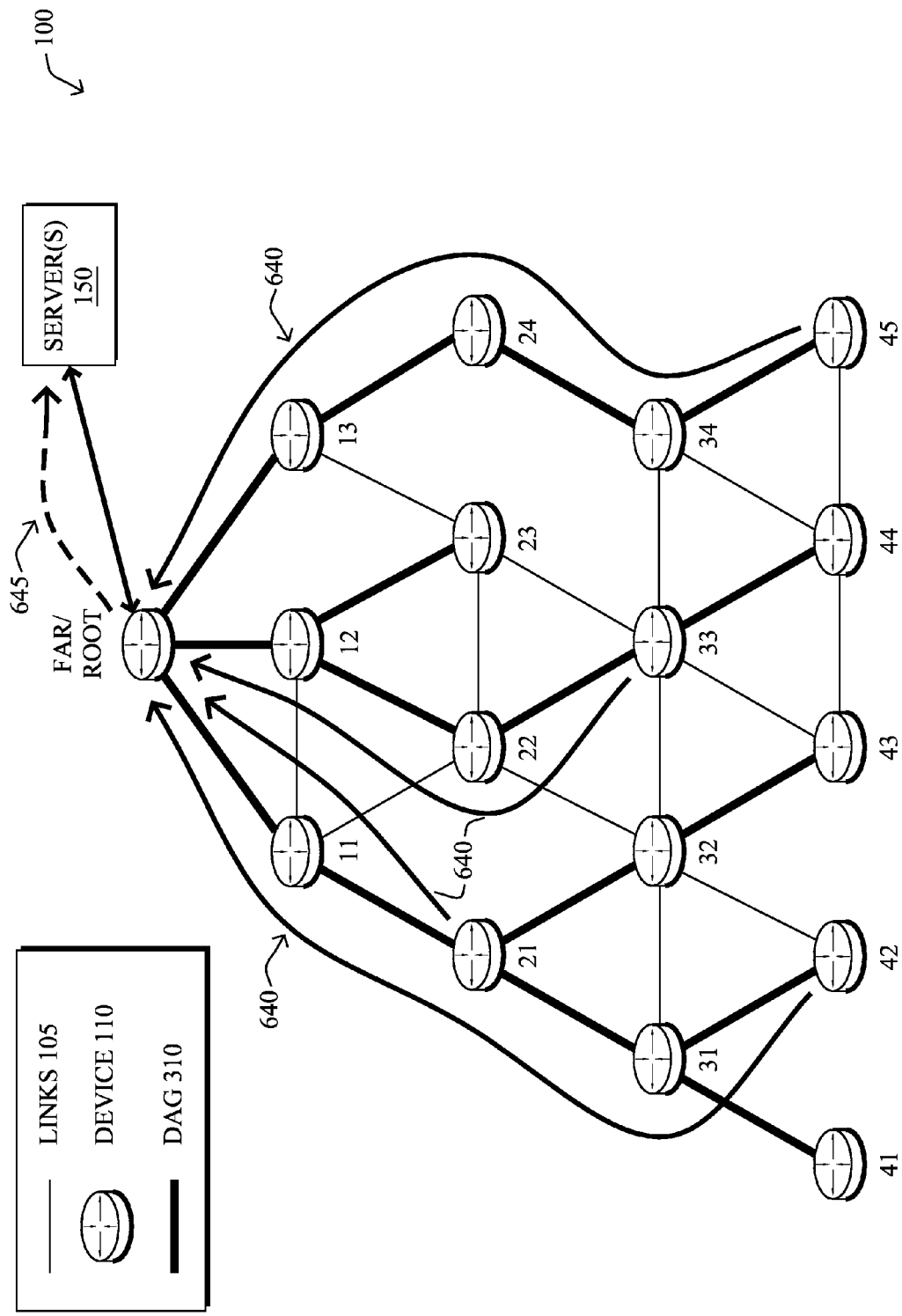
FIG. 6 illustrates an example data passing for a distributed approach for feature modeling.
Figure 7A:
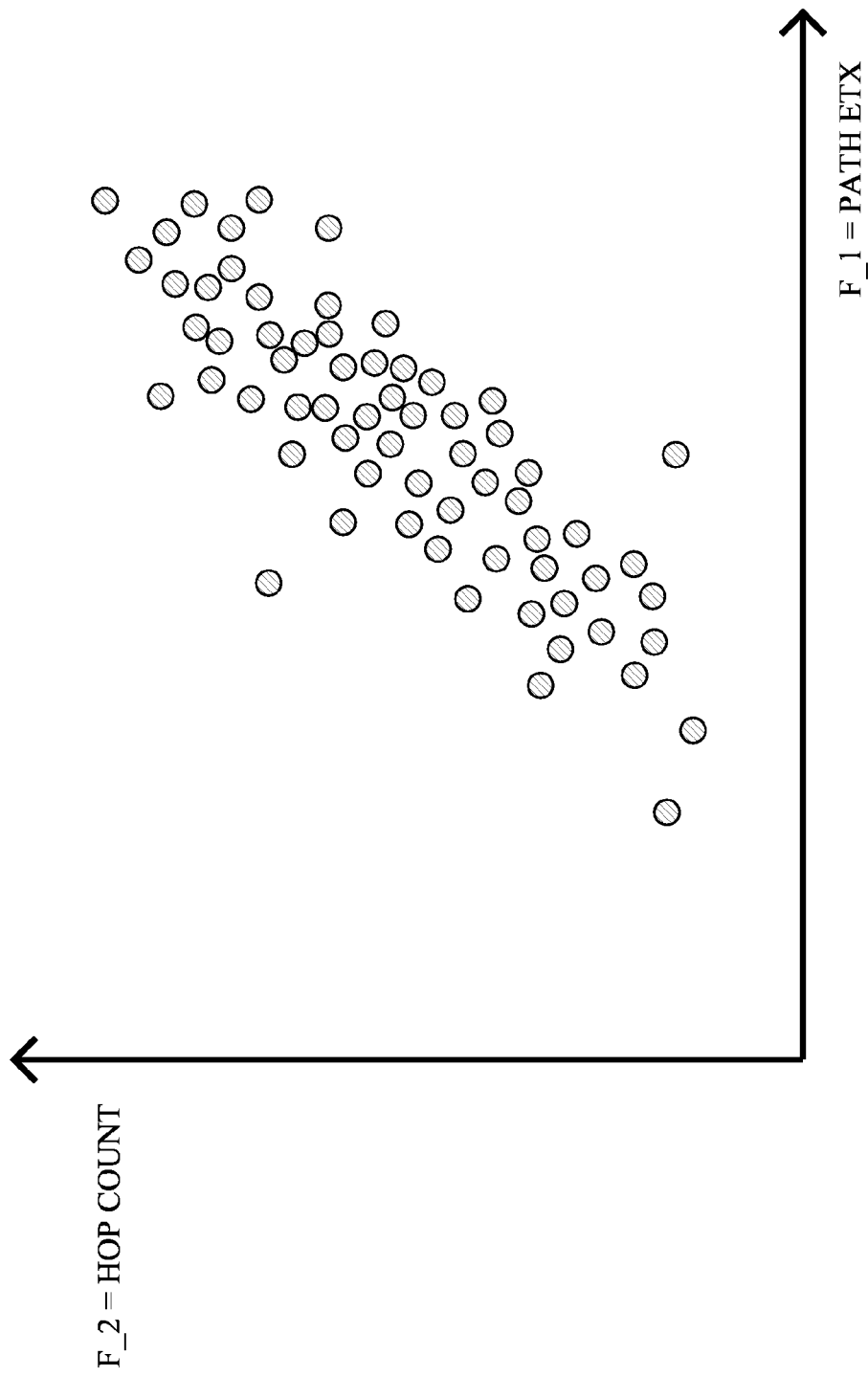
FIGS. 7A-7D illustrate an example update to collected samples and variable correlation.
Figure 7B:
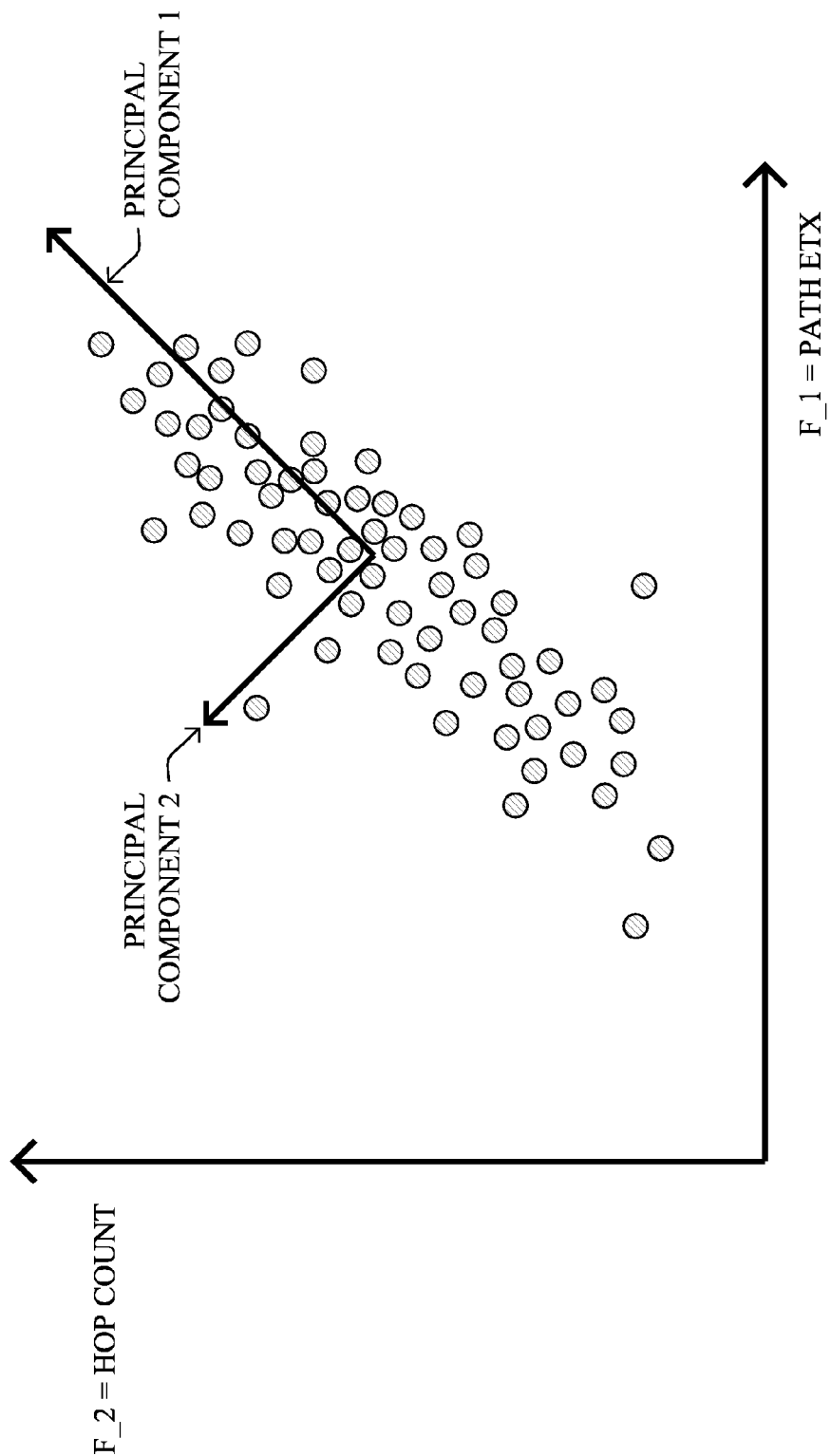
Figure 7C:
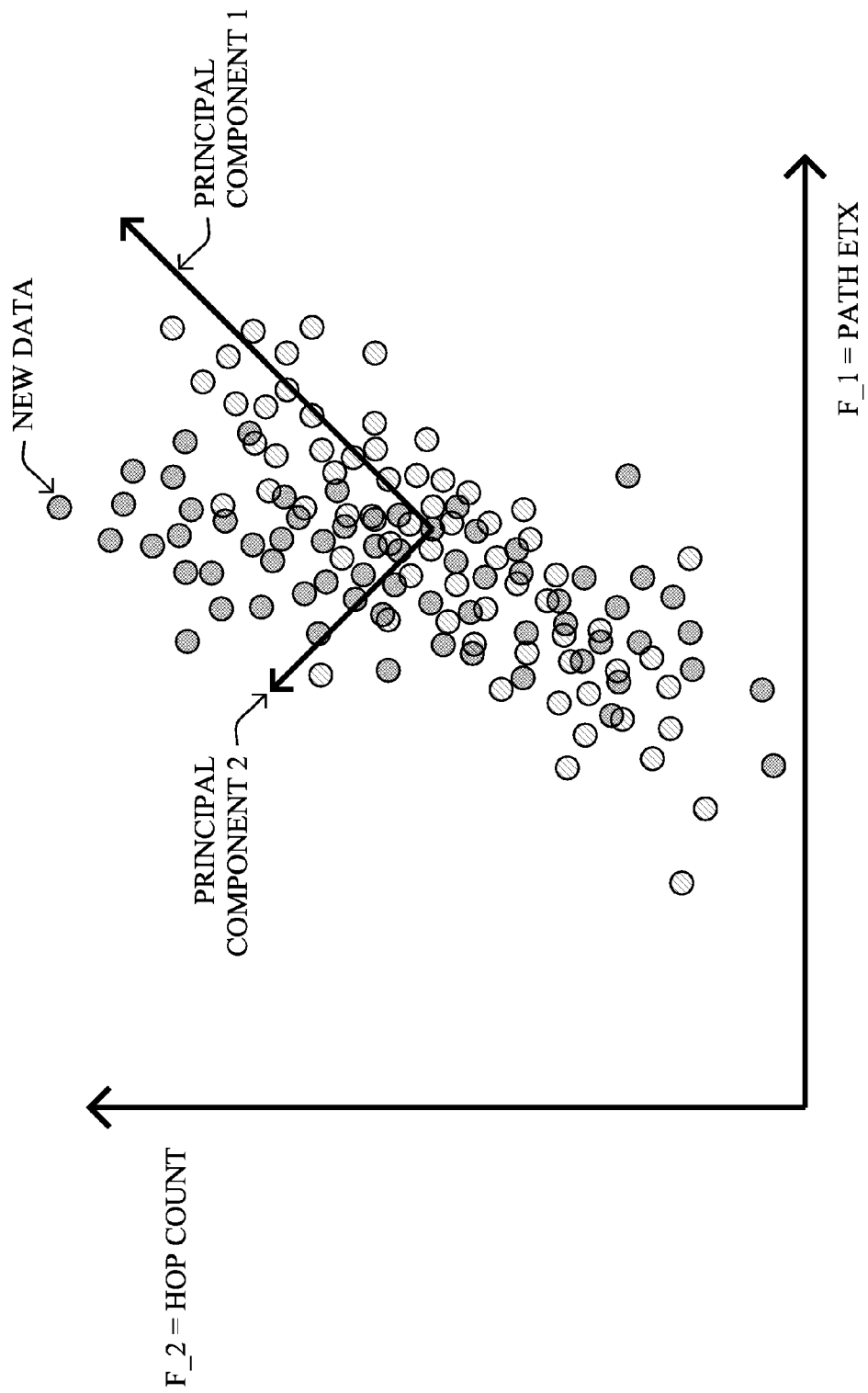
Figure 7D:
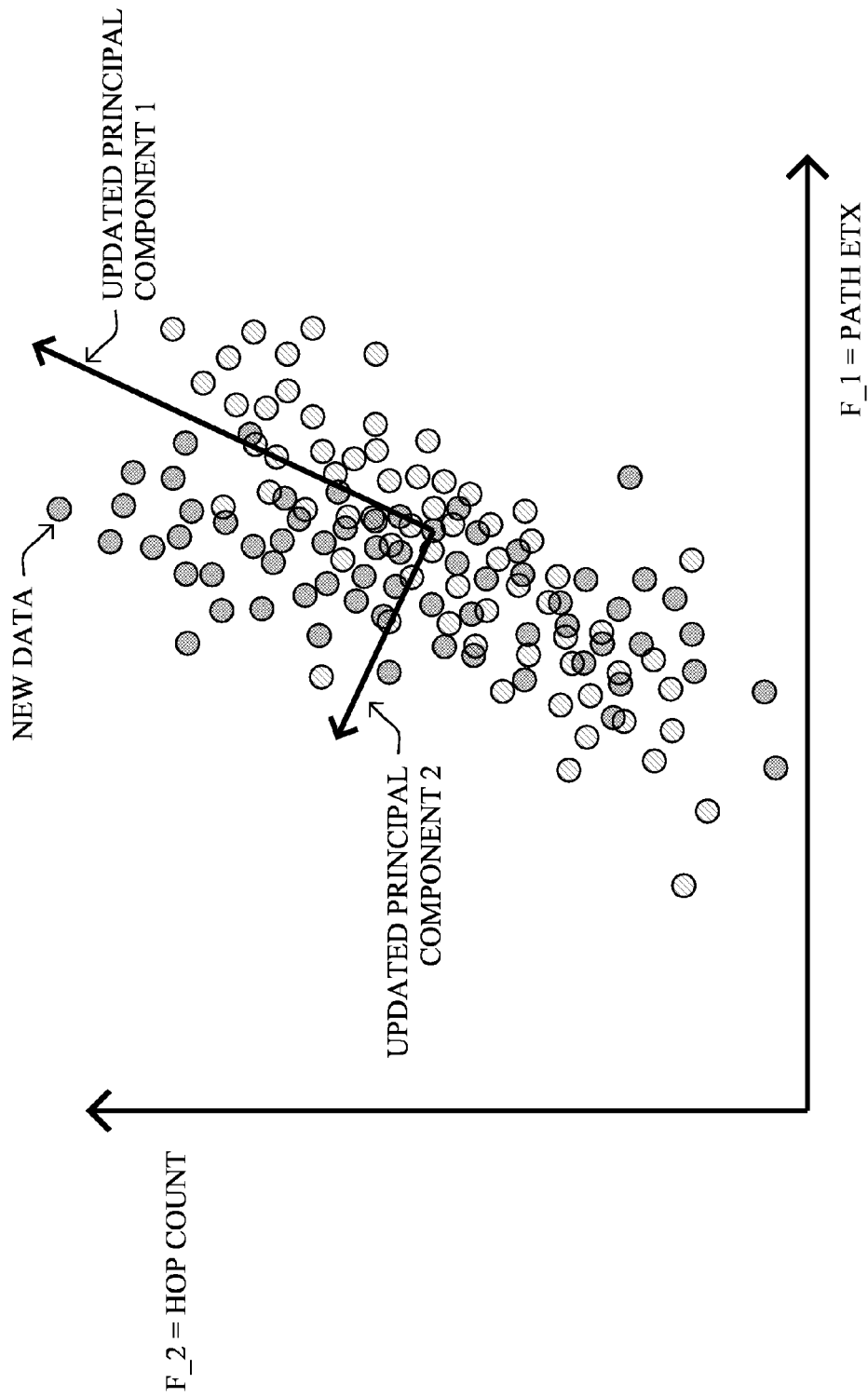

6: Update N: $N_{(1)} = N_{(1)} + N_{(2)}$
7: Update PCA: $U_{(1,2)} = [U_{(1)} \perp \tilde{Z}_{(2)}]U'$
8: Update eigenvalues: $\Sigma_{(1,2)} = \Sigma'$ Referring again to the specific techniques described herein with relation to one or more embodiments of the disclosure, the algorithm followed by the selected node(s) and the router is the following:

1 The node collects locally N_i samples of the set of features F, constructs the matrix Z_i and computes Mu_i. Then, as shown in FIG. 6, it reports to the router the mean value of the collected features via a newly defined IPv6 unicast message 640.

2 Upon receiving all the mean values of each node, the router computes the new global mean value, Mu_R_new, and reports this value and optionally the total number of samples (N_R_new). In one embodiment, these values (Mu_R_new and N_R_new) are to be sent to every node that participates in the distributed PCA computation, and a newly defined IPv6 unicast or multicast message may be sent to every node participating in the distributed PCA computation, accordingly. In another embodiment, as shown in FIG. 6, this report may be found in a newly defined IPv6 unicast message 645 to a server (e.g., an LM hosted on a server, or otherwise). In still another embodiment, a further optimization can be achieved by computing the Mu_R_new completely in-network by using a distributed aggregation tree. In such an instantiation, each node sends messages 640 to its parent in the DAG its Mu_i value. The parent, in turn, aggregates the Mu_i and N_i values received from each of its children, adds its own values and sends the aggregated result to its own parent in the tree. This procedure continues recursively until it reaches the top of the tree, where the FAR receives the already computed Mu_R_new and N_R_new and broadcasts them to every node in the DAG. For example, node 21 may aggregate the data from node 42, and may only send a single message toward the router.

3 Upon receiving Mu_R_new and N_R_new, each device performs the "New data adaptation step" (updating step) described above in the incremental PCA algorithm and sends to the FAR a newly defined IPv6 unicast message (e.g., 640 with different information) containing the values of trans(U_FAR)*~Z_i and ~Z_i-U_FAR*trans(U_FAR)*~Z_i. This corresponds to the right-side block of the R matrix without the orthogonalized component (see above) and is the information that the router needs for performing the update of U_R.

4 Upon receiving all the updated information from all the nodes, the router performs the "Orthogonalization step", constructs the complete R matrix, computes the SVD and performs all the updates for obtaining a new U_R matrix.

The idea behind the incremental PCA algorithm is to use the information in the new data samples that is not well-captured by the current PCA matrix for updating the PCA matrix. In FIGS. 7A-7D, this update is illustrated with an example. The previous algorithm adapts to a distributed environment the computations required for performing this update.

Steps 1 to 4 above are repeated in loop until the router sends a newly defined Stop_mod (unicast or multicast, as discussed above) message to the nodes (similar to message 550 in FIG. 5B above, but with different instructions). In one embodiment, the router sends the Stop_mod message after achieving a predefined value of N_R. In another embodiment, the policy engine allows the model computation just for a certain period of time, and the router sends the Stop_mod message when this period is finished.

Note that the information sent by the node when it performs a "New data adaptation step" is, in terms of dimensions, equivalent to the Z_i matrix. However, the nature of the PCA decomposition allows reducing the size of such message: in particular, after the principal components have been computed, those that are less important can be discarded (as it is done in the example in FIG. 4F), which will reduce the size of the matrix trans (U_FAR)*~Z_i.

With respect to the matrix ~Z_i-U_FAR*trans(U_FAR)*~Z_i (known as the reconstruction error) that represents the error introduced by the incremental PCA transformation with respect to the original feature vector, it always has the size of the new data matrix. However, for a PCA model correctly describing the data, the error values will be low and, therefore, the contents of this matrix can be easily compressed, for example, by using value quantization.

This procedure is driven by the router, which can decide after every update of the PCA matrix how many principal components should be kept. Furthermore, the router will control the number of bins and the bin width in case compression by value quantization wants to be used on the reconstruction error. This information is sent as an additional TLV of the message sent by the router in step 2.

Note that in this description, the number of samples used at each step is decided by the router and is identical for all the nodes. In another embodiment, this number can be different for each node, based on information that the router or the policy engine has about available memory and computational resources in the nodes. In yet another embodiment, the nodes can decide locally the value of N_i based on their current conditions of memory, computational power, battery charge, etc. In these two embodiments, the number of collected samples is reported by the node to the router in the message with the mean value of the features (step 1 of the algorithm).

Figure 8:
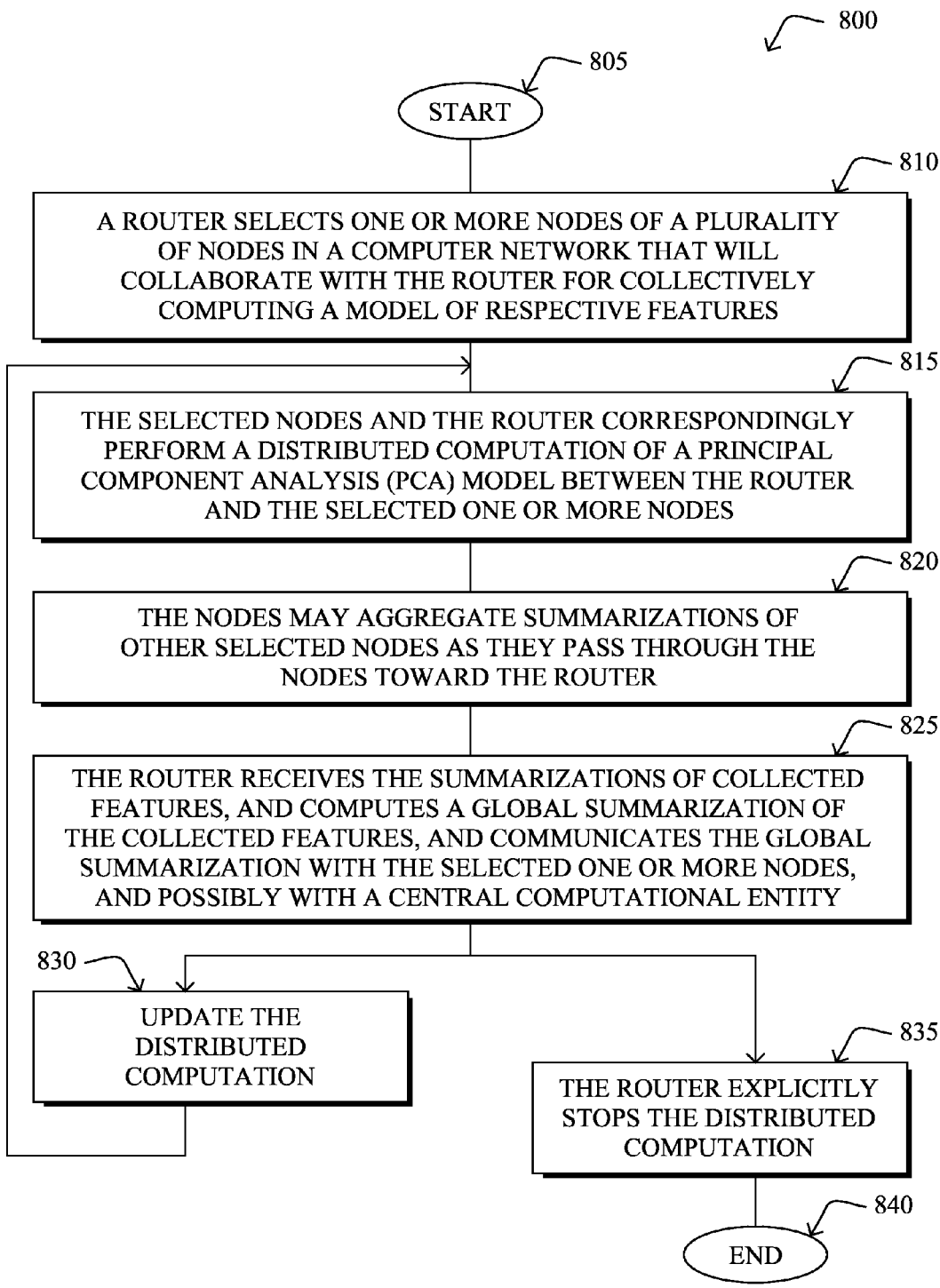
FIG. 8 illustrates an example simplified procedure for a distributed approach for feature modeling on an LLN using principal component analysis.

FIG. 8 illustrates an example simplified procedure 800 for a distributed approach for feature modeling on an LLN using principal component analysis in accordance with one or more embodiments described herein. The procedure 800 may start at step 805, and continues to step 810, where, as described in greater detail above, a router (e.g., FAR) selects one or more nodes of a plurality of nodes in a computer network that will collaborate with the router for collectively computing a model of respective features for input to a learning machine model. For example, as described above, the router may generate a list of candidate nodes for the selected one or more nodes, where the list contains nodes of the plurality of nodes whose features are to be modeled. Also, the router may limit the list of candidate nodes based on various characteristics (e.g., location, type, and property), as mentioned above, and may filter the list of candidate nodes to those nodes that can effectively participate in the model computation (e.g., based on capability, availability, etc.). Note that the nodes may refuse their selection, as described above.

In step 815, the selected nodes and the router correspondingly perform a distributed computation of a Principal Component Analysis (PCA) model between the router and the selected one or more nodes. In particular, as detailed above, the selected one or more nodes are configured to perform the distributed computation by locally collecting features (e.g., where a number of feature samples collected at certain of the selected one or more nodes are different), locally computing a summarization (e.g., mean) of the collected features, and communicating the summarization with the router. Note that as an optional embodiment as mentioned above, in step 820 the nodes may aggregate summarizations of other selected nodes as they pass through the nodes toward the router.

In step 825, the router receives the summarizations of collected features, and computes a global summarization of the collected features, and communicates the global summarization with the selected one or more nodes, and possibly with a central computational entity (e.g., a learning machine). That is, the router is configured to perform the distributed computation by locally computing global summarization (means) and global number of samples, and performing data orthogonalization, as described above. The router and selected one or more nodes may continue to update the distributed computation (i.e., performing data adaptation/PCA updating) via step 830, illustratively until the router explicitly stops the distributed computation based on one or both of time and number of collected features in step 835.

The illustrative and simplified procedure 800 ends in step 840. It should be noted that while certain steps within procedure 800 may be optional as described above, the steps shown in FIG. 8 are merely examples for illustration, and certain other steps may be included or excluded as desired. Further, while a particular order of the steps is shown, this ordering is merely illustrative, and any suitable arrangement of the steps may be utilized without departing from the scope of the embodiments herein.

The techniques described herein, therefore, provide for a distributed approach for feature modeling on an LLN using principal component analysis. In particular, distribution of the computations allows, on the one hand, to perform the model computation even in large LLN networks, and, on the other hand, to reduce the data that has to be sent to the router for the model computation. Such a model can be used, for instance, for detecting anomalous nodes in the network. For instance, as described above, the techniques herein compute a model of the features describing a node or a set of nodes, distribute the computational cost amongst the FAR and all the nodes being modeled and reduce the amount of traffic generated in the network. Indeed, operations requiring low computational power are performed directly in the nodes, which at the same time avoids the necessity of sending feature samples to the FAR, since only the results of these intermediate computations have to be sent. Furthermore, the techniques herein take into account the characteristics of the nodes as well as the current conditions on the network for coordinating the computations.

While there have been shown and described illustrative embodiments that provide for distributed approach for feature modeling on an LLN using principal component analysis, it is to be understood that various other adaptations and modifications may be made within the spirit and scope of the embodiments herein. For example, the embodiments have been shown and described herein with relation to LLNs and related protocols. However, the embodiments in their broader sense are not as limited, and may, in fact, be used with other types of communication networks and/or protocols. In addition, while the embodiments have been shown and described with relation to learning machines in the specific context of communication networks, certain techniques and/or certain aspects of the techniques may apply to learning machines in general or other uses for PCA models (i.e., not limited to learning machine models), without the need for relation to communication networks.

The foregoing description has been directed to specific embodiments. It will be apparent, however, that other variations and modifications may be made to the described embodiments, with the attainment of some or all of their advantages. For instance, it is expressly contemplated that the components and/or elements described herein can be implemented as software being stored on a tangible (non-transitory) computer-readable medium (e.g., disks/CDs/RAM/EEPROM/etc.) having program instructions executing on a computer, hardware, firmware, or a combination thereof. Accordingly this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. A system, comprising:
a plurality of nodes in a computer network; and
a router in the computer network, the router configured to select one or more nodes of the plurality of nodes that will collaborate with the router for collectively computing a model of respective features for a Principal Component Analysis (PCA) model,
wherein the selected one or more nodes and the router are configured to perform a distributed computation of a PCA model between the router and the selected one or more nodes, and
wherein the router is configured to generate a list of candidate nodes for the selected one or more nodes, the list containing nodes of the plurality of nodes whose features are to be modeled.

2. The system as in claim 1, wherein the router is further configured to limit the list of candidate nodes based on characteristics selected from a group consisting of: location, type, and property.

3. The system as in claim 1, wherein the router is further configured to filter the list of candidate nodes to those nodes that can effectively participate in the model computation.

4. The system as in claim 1, wherein the plurality of nodes are configured to refuse selection.

5. The system as in claim 1, wherein the selected one or more nodes are configured to perform the distributed computation by locally collecting features, locally computing a summarization of the collected features, and communicating the summarization with the router.

6. The system as in claim 5, wherein the summarization comprises a mean of the collected features.

7. The system as in claim 5, wherein the router is further configured to compute a global summarization of the collected features, and communicate the global summarization with the selected one or more nodes.

8. The system as in claim 7, wherein the router is further configured to communicate the global summarization with a central computational entity.

9. The system as in claim 7, wherein the router is further configured to perform an orthogonalization of the collected features.

10. The system as in claim 1, wherein the router and selected one or more nodes are further configured to update the distributed computation.

11. The system as in claim 1, wherein the router is further configured to explicitly stop the distributed computation based on one or both of time and number of collected features.

12. The system as in claim 1, wherein the selected one or more nodes are further configured to aggregate summarizations of other selected nodes as the summarizations of other selected nodes pass through the selected one or more nodes toward the router.

13. A method, comprising:
selecting, by a router, one or more nodes of a plurality of nodes in a computer network that will collaborate with the router for collectively computing a model of respective features for input to a Principal Component Analysis (PCA) model;
performing a distributed computation of a PCA model between the router and the selected one or more nodes; and
generating a list of candidate nodes for the selected one or more nodes, the list containing nodes of the plurality of nodes whose features are to be modeled.

14. The method as in claim 13, further comprising:
limiting the list of candidate nodes based on characteristics selected from a group consisting of: location, type, and property; and
filtering the list of candidate nodes to those nodes that can effectively participate in the model computation.

15. The method as in claim 13, further comprising:
computing a global summarization of collected features from the selected one or more nodes; and
communicating the global summarization with the selected one or more nodes.

16. The method as in claim 15, further comprising:
performing an orthogonalization of the collected features.

17. The method as in claim 13, further comprising:
updating the distributed computation.

18. The method as in claim 13, further comprising:
explicitly stopping the distributed computation based on one or both of time and number of collected features.

19. A method, comprising:
determining selection of a particular selected node of one or more nodes that will collaborate with a router for collectively computing a model of respective features for input to a Principal Component Analysis (PCA) model; and
performing a distributed computation of a PCA model between the router and the selected one or more nodes, wherein performing the distributed computation comprises:
locally collecting features,
locally computing a summarization of the collected features, and
communicating the summarization with the router.

20. The method as in claim 19, further comprising:
refusing the selection.

21. The method as in claim 19, further comprising:
updating the distributed computation.

22. The method as in claim 19, further comprising:
aggregating summarizations of other selected nodes as the summarizations of other selected nodes pass through the selected node toward the router.

* * * * *